US012249609B2

(12) United States Patent
Baeck

(10) Patent No.: US 12,249,609 B2
(45) Date of Patent: Mar. 11, 2025

(54) THIN FILM TRANSISTOR AND DISPLAY DEVICE COMPRISING THE SAME

(71) Applicant: LG Display Co., Ltd., Seoul (KR)

(72) Inventor: JuHeyuck Baeck, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 313 days.

(21) Appl. No.: 17/977,669

(22) Filed: Oct. 31, 2022

(65) Prior Publication Data

US 2023/0187452 A1    Jun. 15, 2023

(30) Foreign Application Priority Data

Dec. 10, 2021    (KR) .......................... 10-2021-0176922

(51) Int. Cl.
*H01L 27/12*    (2006.01)
*G02F 1/1368*    (2006.01)
*H10K 59/121*    (2023.01)

(52) U.S. Cl.
CPC ........ *H01L 27/1225* (2013.01); *G02F 1/1368* (2013.01); *H10K 59/1213* (2023.02)

(58) Field of Classification Search
CPC ........... H01L 29/78696; H01L 27/1225; H01L 29/42384; H01L 29/7869; H01L 29/78633; H01L 21/32139; H01L 21/32136; H01L 29/78627; H01L 29/66757; H01L 21/28114; H01L 29/78621; H01L 27/1288; H01L 27/1214; H01L 29/66598; H01L 29/78612; H01L 29/78645; H01L 29/78624; H10K 59/1213; G02F 1/1368
See application file for complete search history.

(56) References Cited

U.S. PATENT DOCUMENTS

| 5,804,474 | A | 9/1998 | Sakaki et al. |
| 6,480,179 | B1 | 11/2002 | Akimoto |
| 2002/0025591 | A1 | 2/2002 | Ohnuma et al. |
| 2002/0158248 | A1* | 10/2002 | Lui .................. H01L 29/78612 257/E29.279 |
| 2003/0057424 | A1 | 3/2003 | Yudasaka et al. |
| 2003/0059989 | A1* | 3/2003 | Yudasaka .......... H01L 29/78696 438/162 |
| 2006/0014335 | A1* | 1/2006 | Ohnuma ........... H01L 21/32139 438/164 |

(Continued)

FOREIGN PATENT DOCUMENTS

| JP | H10-32327 A | 2/1998 |
| KR | 10-0239994 B1 | 1/2000 |

OTHER PUBLICATIONS

European Patent Office, Extended European Search Report and Opinion, EP Patent Application No. 22204614.6, May 10, 2023, eight pages.

*Primary Examiner* — Hoan C Nguyen
(74) *Attorney, Agent, or Firm* — Fenwick & West LLP

(57) ABSTRACT

A display device includes a substrate and multiple thin film transistors, each of which comprises an active layer having a channel portion, and a gate electrode that overlaps the channel portion of the active layer. The gate electrode includes a first part that at least partially overlaps the channel portion, and a second part having a thickness smaller than that of the first part, at least partially overlapping the channel portion, and light transmittance of the second part is greater than that of the first part.

20 Claims, 14 Drawing Sheets

(56) References Cited

U.S. PATENT DOCUMENTS

2012/0319102 A1* 12/2012 Yamazaki ......... H01L 29/66969
　　　　　　　　　　　　　　　　　　　257/E29.296
2020/0212221 A1* 7/2020 Baeck ................ H01L 29/7869
2023/0165057 A1* 5/2023 Ko ...................... H10K 59/126
　　　　　　　　　　　　　　　　　　　257/40

* cited by examiner

THIN FILM TRANSISTOR AND DISPLAY DEVICE COMPRISING THE SAME

CROSS-REFERENCE TO RELATED APPLICATIONS

This application claims the benefit of priority of the Korean Patent Application No. 10-2021-0176922 filed on Dec. 10, 2021, which is incorporated herein by reference in its entirety.

BACKGROUND

Field

One embodiment of the present disclosure relates to a thin film transistor and a display device comprising the same, and more particularly, to a thin film transistor and a display device comprising the same in which a gate electrode has a thickness step profile.

Discussion of the Related Art

Since a thin film transistor can be fabricated on a glass substrate or a plastic substrate, the thin film transistor is widely used as a switching device of a display device such as a liquid crystal display device or an organic light emitting device.

The thin film transistor may be categorized into an amorphous silicon thin film transistor in which amorphous silicon is used as an active layer, a polycrystalline silicon thin film transistor in which polycrystalline silicon is used as an active layer, and an oxide semiconductor thin film transistor in which an oxide semiconductor is used as an active layer, based on a material constituting the active layer.

Among thin film transistors, since the oxide semiconductor thin film transistor (TFT) may have high mobility and have a large resistance change in accordance with an oxygen content, there is an advantage in that desired properties may be easily obtained. Further, since an oxide constituting an active layer may be grown at a relatively low temperature during a process of fabricating the oxide semiconductor thin film transistor, the fabricating cost of the oxide semiconductor thin film transistor is reduced. In view of the properties of oxide, since an oxide semiconductor is transparent, it is favorable to embody a transparent display device.

A display panel constituting a display device is generally fabricated using one large mother substrate. For example, after a plurality of display panels are fabricated using one large mother substrate, the mother substrate is cut to form each display panel.

In the process of fabricating a display panel using a large-sized mother substrate, large-sized deposition equipment may be used to form a plurality of thin film transistors. When elements are fabricated from the large-area mother substrate, a process deviation may occur for each area. As a result, a performance deviation may occur in elements formed in each area, for example, thin film transistors. When a performance deviation occurs, the thin film transistor formed in a partial area may become less reliable, such as a threshold voltage may change significantly over time of use.

Therefore, when a display panel is fabricated using a large-sized mother substrate, it is desired to reduce a performance deviation of the thin film transistor and minimize or avoid deterioration in reliability of the thin film transistor.

SUMMARY

The present disclosure has been made in view of the above problems and it is an object of the present disclosure to minimize a performance deviation of a thin film transistor when a display panel is fabricated using a large-sized mother substrate.

It is another object of the present disclosure to provide a thin film transistor of which reliability is not deteriorated over time even though the thin film transistor is fabricated on a large-sized mother substrate.

It is still another object of the present disclosure to provide a thin film transistor comprising a gate electrode having a thickness step profile.

It is further still another object of the present disclosure to provide a display device comprising the above thin film transistor.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a thin film transistor comprising an active layer having a channel portion, and a gate electrode that overlaps the channel portion of the active layer, wherein the gate electrode includes a first part that at least partially overlaps the channel portion, and a second part having a thickness smaller than a thickness of the first part, at least partially overlapping the channel portion, and wherein light transmittance of the second part is greater than light transmittance of the first part.

The second part may have light transmittance of 5% to 70%.

The first part and the second part may be made of a same material.

The first part may have a thickness of 100 nm or more.

The second part may have a thickness of 5% to 50% relative to the thickness of the first part.

The second part may have a thickness of 10 nm to 50 nm.

Based on a plan view, a ratio of an area occupied by the second part to a total area where the channel portion and the gate electrode overlap each other may be in the range of 10% to 60%.

The gate electrode may have an area transmittance coefficient (ATC) of 1% to 10%, and the area transmittance coefficient (ATC) may be calculated by Equation 1 below:

$$ATC[\%] = T \times A \qquad \text{(Equation 1)},$$

in the Equation 1, T is light transmittance of the second part, which is represented by %, and the light transmittance is average light transmittance measured in the range of 360 nm to 740 nm, and A is an area ratio of the second part, which is calculated by Equation 2 below:

$$A = (\text{area of the second part that overlaps the channel portion})/(\text{area of the gate electrode that overlaps the channel portion}) \qquad \text{(Equation 2)}.$$

The second part may have a circular shape, an oval shape, a semi-circular shape, a semi-oval shape, or a polygonal plane, in plan view.

The first part may be positioned on one side of the gate electrode, and the second part may be positioned on the other side of the gate electrode.

The first part may be disposed to surround the second part.

The gate electrode may include at least one of molybdenum (Mo) or titanium (Ti).

The active layer may include at least one of an IGZO (InGaZnO)-based oxide semiconductor material, a GZO (GaZnO)-based oxide semiconductor material, an IGO(In- GaO)-based oxide semiconductor material, an IGZTO (InGaZnSnO)-based oxide semiconductor material, a GZTO (GaZnSnO)-based oxide semiconductor material, an IZO (InZnO)-based oxide semiconductor material, an ITZO (InSnZnO)-based oxide semiconductor material, a FIZO (FeInZnO)-based oxide semiconductor material, a ZnO-based oxide semiconductor material, a SIZO(SiInZnO)-based oxide semiconductor material or a ZnON(Zn-Oxynitride)-based oxide semiconductor material.

The active layer may include a first oxide semiconductor layer, and a second oxide semiconductor layer on the first oxide semiconductor layer.

The active layer may further include a third oxide semiconductor layer on the second oxide semiconductor layer.

In accordance with another aspect of the present disclosure, the above and other objects can be accomplished by the provision of a mother panel comprising a mother substrate having one or more display panel areas, and a plurality of thin film transistors disposed on the mother substrate, wherein the mother substrate has a first area and a second area, which are distinguished from each other, each of the plurality of thin film transistors includes an active layer and a gate electrode, the active layer includes a channel portion, a gate electrode of a thin film transistor disposed in the first area includes a first part that at least partially overlaps the channel portion of the active layer, and a second part having a thickness smaller than a thickness of the first part and at least partially overlapping the channel portion of the active layer, and wherein light transmittance of the second part is greater than light transmittance of the first part.

The gate electrode of the thin film transistor disposed in the second area may have a same height as that of the first part without a thickness step profile.

The mother substrate may have a third area distinguished from the first area and the second area, a gate electrode of the thin film transistor disposed in the third area may include a first part that at least partially overlaps the channel portion of the active layer, and a second part having a thickness smaller than a thickness of the first part and at least partially overlapping the channel portion of the active layer, and the second part of the gate electrode included in the thin film transistor disposed in the third area may have a smaller area or a larger thickness than that of the second part of the gate electrode included in the thin film transistor disposed in the first area.

In accordance with another aspect of the present disclosure, the above and other objects can be accomplished by the provision of a display device comprising a plurality of pixels having a pixel driving circuit, wherein the pixel driving circuit includes the above thin film transistor.

The display device may further comprise a gate driver disposed on a substrate, the gate driver including a plurality of thin film transistors, wherein each of the plurality of thin film transistors of the gate driver may include an active layer and a gate electrode, the gate electrode of the thin film transistor disposed in the gate driver may have the same thickness as a thickness of a first part of the gate electrode of the thin film transistor disposed in the pixel driving circuit without a thickness step profile.

In accordance with other aspect of the present disclosure, the above and other objects can be accomplished by the provision of a display device comprising a substrate, and a plurality of thin film transistors on the substrate, wherein each of the plurality of thin film transistors includes an active layer having a channel portion and a gate electrode spaced apart from the active layer, the substrate includes a first area, the gate electrode of the thin film transistor disposed in the first area includes a first part that at least partially overlaps the channel portion of the active layer, and a second part having a thickness smaller than a thickness of the first part and at least partially overlapping the channel portion of the active layer, and light transmittance of the second part is greater than that of the first part.

The substrate may further include a second area distinguished from the first area, and the gate electrode of the thin film transistor disposed in the second area may have the same height as a height of the first part without a thickness difference.

The substrate may further include a third area distinguished from the first area and the second area, a gate electrode of the thin film transistor disposed in the third area may include a first part that at least partially overlaps the channel portion of the active layer, and a second part having a thickness smaller than the first part and at least partially overlapping the channel portion of the active layer, and the second part of the gate electrode included in the thin film transistor disposed in the third area may have a smaller area or a larger thickness than that of the second part of the gate electrode included in the thin film transistor disposed in the first area.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1A:
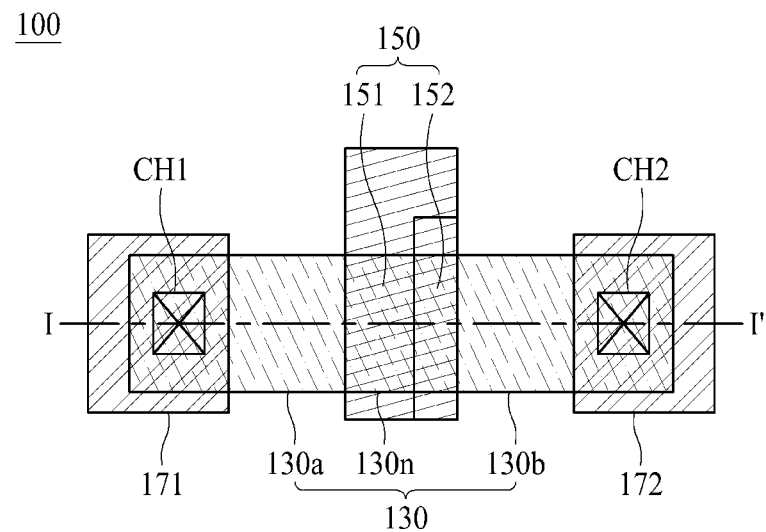
FIG. 1A is a plan view illustrating a thin film transistor according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

Spatially relative terms such as "below", "beneath", "lower", "above", and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below", or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present invention.

The term "at least one" should be understood as including any and all combinations of one or more of the associated listed items. For example, the meaning of "at least one of a first item, a second item, and a third item" denotes the combination of all items proposed from one or more of the first item, the second item, and the third item as well as one or more of the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the drawings, the same or similar elements are denoted by the same reference numerals even though they are depicted in different drawings.

In the embodiments of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In some embodiments of the present disclosure, for convenience of description, a source region is distinguished from a source electrode, and a drain region is distinguished from a drain electrode. However, the embodiments of the present disclosure are not limited to this structure. For example, a source region may be a source electrode, and a drain region may be a drain electrode. Also, a source region may be a drain electrode, and a drain region may be a source electrode.

Figure 1B:
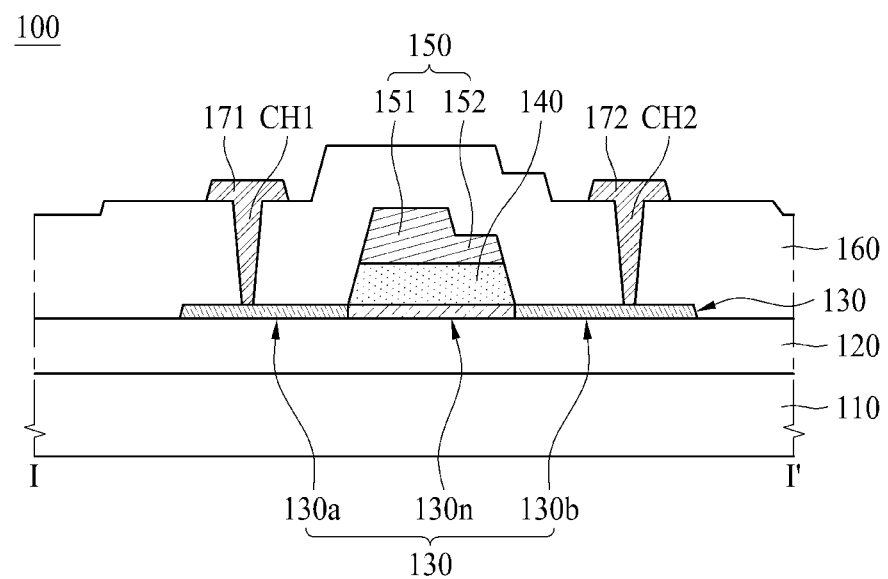
FIG. 1B is a cross-sectional view taken along line I-I' of FIG. 1A according to an embodiment of the present disclosure.

FIG. 1A is a plan view illustrating a thin film transistor according to one embodiment of the present disclosure, and FIG. 1B is a cross-sectional view taken along line I-I' of FIG. 1A.

The thin film transistor 100 according to one embodiment of the present disclosure includes an active layer 130, and a gate electrode 150 at least partially overlapped with the active layer 130. Referring to FIG. 1B, the gate electrode 150 has a thickness step profile.

Referring to FIG. 1B, the thin film transistor 100 according to one embodiment of the present disclosure is disposed on a substrate 110.

Glass or plastic may be used as the substrate 110. A transparent plastic, e.g., polyimide, having a flexible property may be used as the plastic. When the polyimide is used as the substrate 110, a heat-resistant polyimide capable of enduring a high temperature may be used considering that a high temperature deposition process is performed on the substrate 110.

A buffer layer 120 may be disposed on the substrate 110. The buffer layer 120 may include at least one of a silicon oxide, a silicon nitride or a metal-based oxide. The buffer layer 120 may protect the active layer 130 by blocking oxygen ($O_2$) or moisture ($H_2O$) permeated from the substrate 110. Further, an upper surface of the substrate 110 may be uniform by the buffer layer 120.

Referring to FIG. 1B, the active layer 130 is disposed on the buffer layer 120.

The active layer 130 includes a semiconductor material. According to one embodiment of the present disclosure, the active layer 130 may include an oxide semiconductor material.

According to one embodiment of the present disclosure, the active layer 130 includes a channel portion 130n, a first connection portion 130a and a second connection portion 130b. The first connection portion 130a is in contact with a side of the channel portion 130n, and the second connection portion 130b is in contact with the other side of the channel portion 130n.

The first connection portion 130a and the second connection portion 130b may be formed by selective conductorization for the active layer 130. Providing conductivity to a selected part of active layer 130 is referred to as a selective conductorization. Selective conductorization can be performed by doping, plasma treatment, or the like. The first connection portion 130a and the second connection portion 130b are referred to as "conductorization portions". According to one embodiment of the present disclosure, the first connection portion 130a of the active layer 130 may be a source area, and the second connection portion 130b may be a drain area, but one embodiment of the present disclosure is not limited thereto, and the first connection portion 130a may be a drain area and the second connection portion 130b may be a source area.

According to one embodiment of the present disclosure, the active layer 130 may include at least one of an IGZO (InGaZnO)-based oxide semiconductor material, a GZO (GaZnO)-based oxide semiconductor material, an IGO(InGaO)-based oxide semiconductor material, an IGZTO (InGaZnSnO)-based oxide semiconductor material, a GZTO (GaZnSnO)-based oxide semiconductor material, an IZO (InZnO)-based oxide semiconductor material, an ITZO (InSnZnO)-based oxide semiconductor material, a FIZO (FeInZnO)-based oxide semiconductor material, a ZnO-based oxide semiconductor material, a SIZO(SiInZnO)-based oxide semiconductor material or a ZnON(Zn-Oxynitride)-based oxide semiconductor material, but one embodiment of the present disclosure is not limited thereto, and the active layer 130 may be formed by another oxide semiconductor material known in the art.

Although FIG. 1B illustrates that the active layer 130 is formed of one layer, one embodiment of the present disclosure is not limited thereto. The active layer 130 may have a single layered structure, or may have a multi-layered structure.

A gate insulating layer 140 is disposed on the active layer 130. The gate insulating layer 140 protects the channel portion 130n.

The gate insulating layer 140 may include at least one of a silicon oxide, a silicon nitride or a metal-based oxide. The gate insulating layer 140 may have a single layered structure, or may have a multi-layered structure.

Referring to FIG. 1B, the gate insulating layer 140 may have a patterned structure. In the process of patterning the gate insulating layer 140, the active layer 130 may be selectively made conductive so that the first connection portion 130a and the second connection portion 130b may be formed, but one embodiment of the present disclosure is not limited thereto. The gate insulating layer 140 may be disposed on an entire surface of the substrate 110 without being patterned (see FIG. 7).

The gate electrode 150 is disposed on the gate insulating layer 140. The gate electrode 150 overlaps the channel portion 130n of the active layer 130.

The gate electrode 150 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd) or titanium (Ti). The gate electrode 150 may have a multi-layered structure that includes at least two conductive layers having their respective physical properties different from each other.

In more detail, the gate electrode 150 may include at least one of molybdenum (Mo) or titanium (Ti).

According to one embodiment of the present disclosure, the gate insulating layer 140 may be patterned by an etching process using the gate electrode 150 as a mask. In this process, the active layer 130 may be selectively made conductive to form the first connection portion 130a and the second connection portion 130b. In more detail, according to one embodiment of the present disclosure, an area of the active layer 130, which overlaps the gate electrode 150, is not made conductive, and thus may become the channel portion 130n having semiconductor characteristics, an area of the active layer, which does not overlap the gate electrode 150, is made conductive, and thus may become the first connection portion 130a and the second connection portion 130b.

According to one embodiment of the present disclosure, the gate electrode 150 includes a first part 151 and a second part 152. Referring to FIGS. 1A and 1B, the first part 151 at least partially overlaps the channel portion 130n. The second part 152 has a thickness smaller than a thickness of the first part 151, and at least partially overlaps the channel portion 130n.

Due to a thickness difference between the first part 151 and the second part 152, the gate electrode 150 may have a thickness step profile. In one embodiment of the present disclosure, the thickness step profile of the gate electrode 150 means that one gate electrode 150 includes a portion having different thicknesses without having the same thickness.

Referring to FIG. 1A, the first part 151 may be disposed on one side of the gate electrode 150, and the second part 152 may be disposed on the other side of the gate electrode 150, but one embodiment of the present disclosure is not limited thereto. The arrangement type of the first part 151 and the second part 152 may vary as needed.

Referring to FIG. 1A, the second part 152 may have a rectangular plane, but one embodiment of the present disclosure is not limited thereto, and the second part 152 may have various planar shapes. For example, the second part 152 may have a circular shape, an oval shape, a semi-circular shape, a semi-oval shape, or a polygonal plane, or may have an irregular planar shape.

According to one embodiment of the present disclosure, light transmittance of the second part 152 is greater than light transmittance of the first part 151. According to one embodiment of the present disclosure, light transmittance refers to average light transmittance in the range of 360 nm to 740 nm. The light transmittance may be measured by a spectrophotometer in accordance with the known method. For example, a product of KONICA MINOLTA may be used as the spectrophotometer.

According to one embodiment of the present disclosure, the first part 151 does not have light transmissive characteristics or is substantially free of light transmissive characteristics, and only the second part 152 may have light transmissive characteristics. In more detail, the first part 151 of the gate electrode 150 may be made to prevent light from being transmitted therethrough in the same manner as the gate electrode that is conventionally known, and the second part 152 may be made to transmit light therethrough.

When the second part 152 has light transmissive characteristics, light may be transmitted through the second part 152 to selectively irradiate light to the channel portion 130n. When light is selectively irradiated to the channel portion 130n, an electron trap generated on an interface between the channel portion 130n and the gate insulating layer 140 may be resolved, that is to say the electron trap may be alleviated.

When the active layer 130 is formed of an oxide semiconductor, an electron trap may be generated on the interface between the channel portion 130n of the active layer 130 and the gate insulating layer 140. When the electron trap is generated, mobility of the thin film transistor 100 may deteriorate, and a threshold voltage of the thin film transistor 100 may vary due to the electron trap.

In addition, the electron trap may be non-uniform depending on the use time of the thin film transistor 100. In this case, the threshold voltage of the thin film transistor 100 may be unstable. As a result, since reliability of the thin film transistor 100 may deteriorate, it is required to resolve the electron trap to improve reliability of the thin film transistor 100.

According to one embodiment of the present disclosure, light may be transmitted through the second part 152 of the gate electrode 150, and the electron trap of the active layer may be resolved by the transmitted light.

For example, when the thin film transistor 100 according to one embodiment of the present disclosure is used for the display device, light emitted from the display device may be irradiated to the channel portion 130n by passing through the second part 152 of the gate electrode 150. When the light is irradiated to the channel portion 130n, the electron trap generated on the interface between the channel portion 130n and the gate insulating layer 140 may be resolved. When the electron trap of the channel portion 130n is resolved, instability of the threshold voltage of the thin film transistor 100 may be removed.

In order to resolve the electron trap by light transmission, according to one embodiment of the present disclosure, the second part 152 may have light transmittance of 5% to 70%. In more detail, the second part 152 may have average light transmittance of 5% to 70% in the range of 360 nm to 740 nm. The light transmittance may be measured by a spectrophotometer, for example, a spectrophotometer from KONICA MINOLTA.

When the light transmittance of the second part 152 is less than 5%, an electron trap removal effect by the light transmission may not be sufficiently exhibited. When the light transmittance of the second part 152 exceeds 70%, intensity of the light passing through the second part 152 may be greater than necessary, so that the channel portion 130n may be damaged, and the thickness of the second part 152 may be too thin to achieve light transmittance of more than 70%, whereby film stability of the second part 152 may deteriorate. According to one embodiment of the present disclosure, the second part 152 may have light transmittance of 10% to 50%, and may have light transmittance of 20% to 50%.

The thickness of the first part 151 and the thickness of the second part 152 may vary depending on the material constituting the gate electrode 150. According to one embodiment of the present disclosure, the first part 151 and the second part 152 may be made of the same material, for example, a metal or a metal alloy.

According to one embodiment of the present disclosure, in order to avoid light transmission through the first part 151, the first part 151 may have a thickness of 100 nm or more. When the first part 151 is made of a metal or a metal alloy and the thickness of the first part 151 is greater than or equal to 100 nm, light may be almost or completely blocked by the first part 151. When the thickness of the first part 151 is greater than or equal to 100 nm, the first part 151 may have light transmittance close to zero (0).

According to one embodiment of the present disclosure, the gate electrode 150 may have a thickness of 500 nm or less. Therefore, according to one embodiment of the present disclosure, the first part 151 may have a thickness of 100 nm to 500 nm. In more detail, the first part 151 may have a thickness of 100 nm to 300 nm. Alternatively, the first part 151 may have a thickness of 150 nm to 500 nm, may have a thickness of 150 nm to 300 nm, or may have a thickness of 200 nm to 500 nm.

The second part 152 may have a thickness of 5% to 50% relative to the thickness of the first part 151 to have predetermined light transmittance. When the thickness of the second part 152 exceeds 50% of the thickness of the first part 151, a light transmissive effect through the second part 152 may hardly occur. On the other hand, when the thickness of the second part 152 is less than 5% of the thickness of the first part 151, film stability of the second part 152 may deteriorate.

According to one embodiment of the present disclosure, the second part 152 may have a thickness of 10 nm to 50 nm to have light transmittance. The second part 152 may be made of a metal or a metal alloy, and light may be transmitted through the second part 152 when the thickness of the second part 152 is 10 nm to 50 nm. When light is transmitted through the second part 152, the channel portion 130n may be selectively exposed to light.

When the thickness of the second part 152 is less than 10 nm, intensity of the light passing through the second part 152 may be more increased than necessary, film stability of the gate electrode 150 may deteriorate, and an electric field effect by the gate electrode 150 may not be sufficiently expressed. When the thickness of the second part 152 exceeds 50 nm, light transmittance may deteriorate, whereby the light transmissive effect may not be expressed. The thickness of the second part 152 may vary depending on the type of the material used as the gate electrode 150, and may be set in consideration of optical characteristics of the material used as the gate electrode 150.

According to one embodiment of the present disclosure, the thickness of the second part 152 may range from 15 nm to 50 nm, may range from 20 nm to 50 nm, or may range from 20 nm to 30 nm.

An area of the second part 152 may vary depending on light transmittance of the second part 152 and the degree of electron trap generated in the thin film transistor 100.

According to one embodiment of the present disclosure, a ratio of an area occupied by the second part 152 to a total area where the channel portion 130n and the gate electrode 150 overlap each other, based on a plan view, may range from 10% to 60%. Therefore, light transmission may be performed for the area of 10% to 60% of the area of the channel portion 130n.

Based on the plan view, when the area occupied by the second part 152 in the entire area where the channel portion 130n and the gate electrode 150 overlap each other is less than 10%, the electron trap removal effect by light transmission may not be sufficiently exhibited. On the other hand, when the area occupied by the second part 152 in the entire area where the channel portion 130n and the gate electrode 150 overlap each other exceeds 60%, a light irradiation area of the channel portion 130n is increased so that carriers may be more increased than necessary, whereby the threshold voltage of the thin film transistor 100 may be shifted in a negative (−) direction. In more detail, the area occupied by the second part 152 in the entire area where the channel portion 130n and the gate electrode 150 overlap each other may range from 10% to 50%, or may range from 15% to 45%.

The detailed area occupied by the second part 152 may vary depending on light transmittance of the second part 152. According to one embodiment of the present disclosure, the area of the second part 152 may be determined in consideration of light transmittance of the second part 152.

According to one embodiment of the present disclosure, the gate electrode 150 has an area transmittance coefficient (ATC) calculated by Equation 1 below. According to one embodiment of the present disclosure, the area transmittance coefficient (ATC) defines a relation between the area occupied by the second part 152 overlapped with the channel portion 130n and light transmittance of the second part 152.

$$ATC[\%] = T \times A \quad \text{(Equation 1)}$$

In the Equation 1, T is light transmittance of the second part 152, and is represented by %. In this case, light transmittance refers to average light transmittance measured in the range of 360 nm to 740 nm.

In the Equation 1, A is an area ratio of the second part 152, and is calculated in Equation 2 below.

$$A = \text{(area of the second part that overlaps the channel portion)/(area of the gate electrode that overlaps the channel portion)} \quad \text{(Equation 2)}$$

In the Equation 2, the area of the second part 152 that overlaps the channel portion 130n corresponds to an area of the channel portion 130n, which overlaps the second part 152. The area of the gate electrode 150 that overlaps the channel portion 130n corresponds to the area of the channel portion 130n.

For example, when light transmittance of the second part 152 is 20% and the ratio of the area of the second part 152 that overlaps the channel portion 130n to the area of the gate electrode 150 that overlaps the channel portion 130n is 0.2, the area transmittance coefficient (ATC) of the gate electrode 150 is as follows $$ATC[\%] = T \times A = 20\% \times 0.2 = 4\%$$

According to one embodiment of the present disclosure, the gate electrode 150 may have an area transmittance coefficient (ATC) of 1% to 10%.

When the area transmittance coefficient (ATC) of the gate electrode 150 is less than 1%, the amount of light transmitted through the second part 152 of the gate electrode 150 is reduced, and as a result, the electron trap removal effect by light transmission may not be sufficiently exhibited. On the other hand, when the area transmittance coefficient (ATC) of the gate electrode 150 exceeds 10%, the amount of light transmitted through the second part 152 of the gate electrode 150 increases, and as a result, the channel portion 130n may be damaged or the threshold voltage of the thin film transistor 100 may be shifted in the negative (−) direction due to excessive light irradiation to the channel portion 130n.

According to one embodiment of the present disclosure, the gate electrode 150 may have an area transmittance coefficient (ATC) of 1% to 7%, or may have an area transmittance coefficient (ATC) of 1% to 5%.

Referring to FIG. 1B, an interlayer insulating layer 160 may be disposed on the gate electrode 150. The interlayer insulating layer 160 may be made of an organic or inorganic insulating material. The interlayer insulating layer 160 may be formed of a composite layer of an organic layer and an inorganic layer.

According to one embodiment of the present disclosure, the thin film transistor 100 may include a first electrode 171 and a second electrode 172, which are disposed on the interlayer insulating layer 160. The first electrode 171 may serve as a source electrode, and the second electrode 172 may serve as a drain electrode, but one embodiment of the present disclosure is not limited thereto. The first electrode 171 may serve as a drain electrode, and the second electrode 172 may serve as a source electrode. In addition, the first connection portion 130a and the second connection portion 130b may serve as a source electrode and a drain electrode, respectively, and the first electrode 171 and the second electrode 172 may serve as connection electrodes between elements.

Referring to FIGS. 1A and 1B, the first electrode 171 and the second electrode 172 may be connected to the active layer 130 through contact holes CH1 and CH2, respectively. In detail, the first electrode 171 may be in contact with the first connection portion 130a through the contact hole CH1. The second electrode 172 may be spaced apart from the first electrode 171 to contact the second connection portion 130b through the contact hole CH2.

Figure 2:
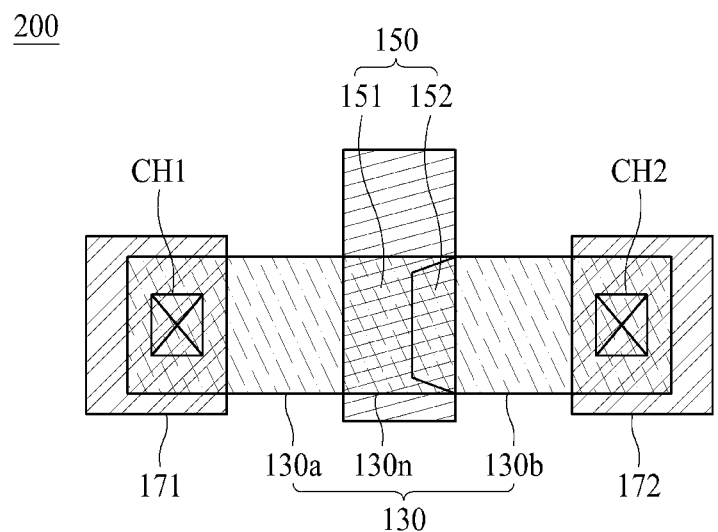
FIG. 2 is a plan view illustrating a thin film transistor according to another example of the present disclosure.

FIG. 2 is a plan view illustrating a thin film transistor 200 according to another embodiment of the present disclosure. Hereinafter, the description of the elements that are already described will be omitted to avoid redundancy.

Referring to FIG. 2, the second part 152 of the gate electrode 150 may have a trapezoidal flat plane. The second part 152 may be disposed on one side of the gate electrode 150. The second part 152 may be disposed in a direction of the second connection portion 130b that is in contact with the second electrode 172 serving as a drain electrode. That is to say that the longest side of the trapezoidal shaped plane of the second part may be disposed towards the second connection portion 130b that is in contact with the second electrode 172.

However, another embodiment of the present disclosure is not limited to FIG. 2. For example, the second part 152 may be disposed in a direction of the first connection portion 130a that is in contact with the first electrode 171 serving as a source electrode. Also, as already described above, the second part 152 may have a circular shape, an oval shape, a semi-circular shape, a semi-oval shape, or a polygonal plane, or may have various planar shapes in addition to the shape shown in the drawing.

Figure 3:
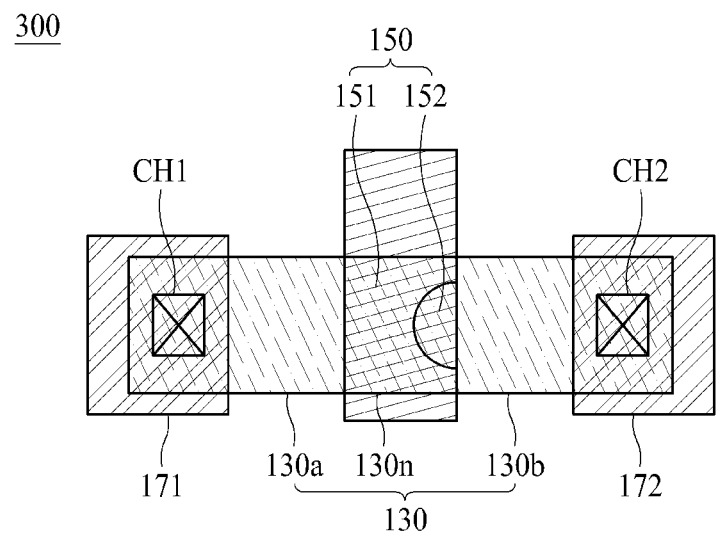
FIG. 3 is a plan view illustrating a thin film transistor according to another example of the present disclosure.

FIG. 3 is a plan view illustrating a thin film transistor 300 according to another embodiment of the present disclosure.

Referring to FIG. 3, the second part 152 of the gate electrode 150 may have a semi-circular shape. A planar shape of the second part 152 in which a diameter portion of a semi-circle is directed toward an edge portion of the gate electrode 150 is shown in FIG. 3, but another embodiment of the present disclosure is not limited thereto. The diameter portion of the semi-circle may be disposed toward a center portion of the gate electrode 150.

Figure 4A:
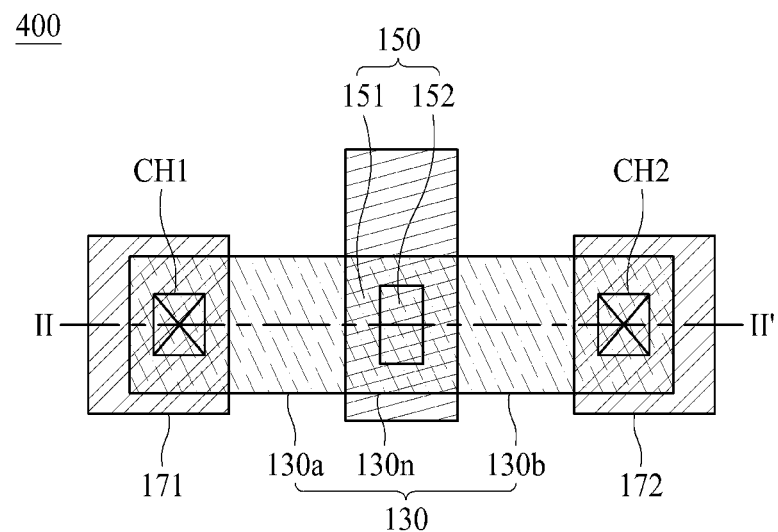
FIG. 4A is a plan view illustrating a thin film transistor according to another example of the present disclosure.
Figure 4B:
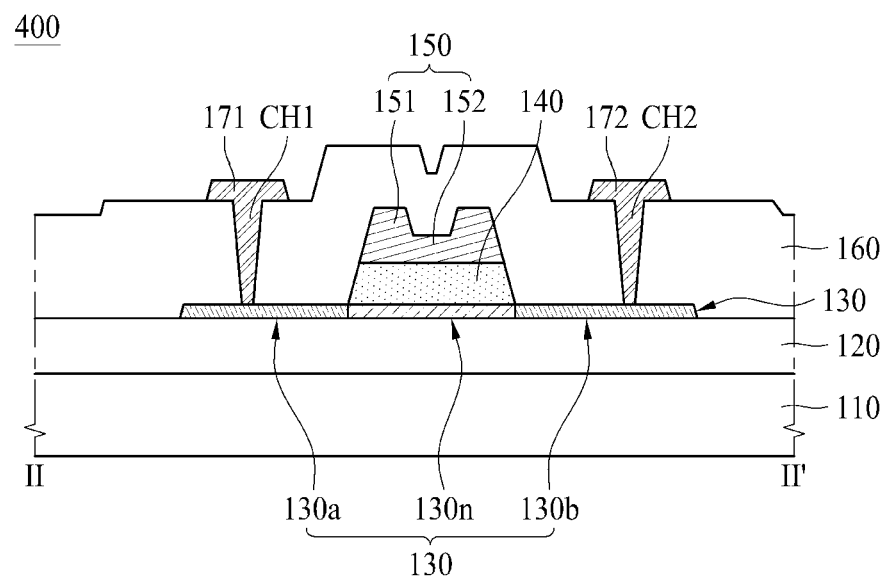
FIG. 4B is a cross-sectional view taken along line II-II' of FIG. 4A according to an embodiment of the present disclosure.

FIG. 4A is a plan view illustrating a thin film transistor 400 according to still another embodiment of the present disclosure, and FIG. 4B is a cross-sectional view taken along line II-II' of FIG. 4A.

Referring to FIG. 4A, the second part 152 may be positioned at the center of the gate electrode 150 based on a plan view. In detail, the second part 152 may overlap the channel portion 130n, and the first part 151 may be disposed to surround the second part 152.

Referring to FIG. 4B, based on the cross-sectional view, the first part 151 more protruded than the second part 152 may be disposed on both sides of the second part 152.

Figure 5:
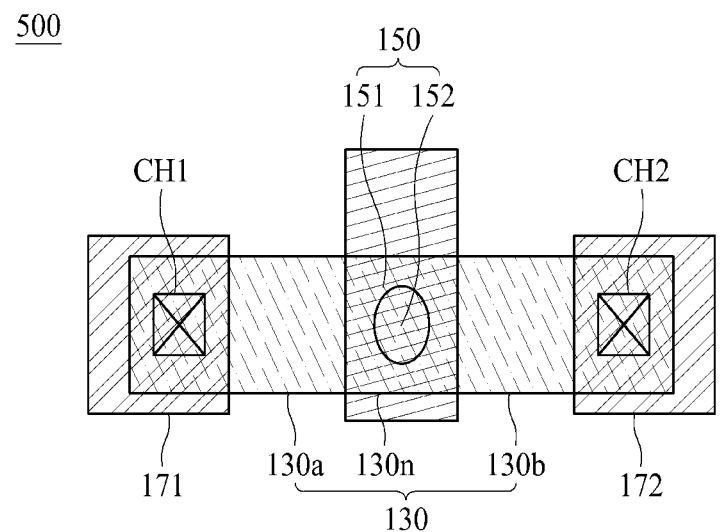
FIG. 5 is a plan view illustrating a thin film transistor according to another example of the present disclosure.

FIG. 5 is a plan view illustrating a thin film transistor 500 according to further still another embodiment of the present disclosure.

Referring to FIG. 5, the second part 152 overlaps the channel portion 130n, and may have a circular or oval plane. The first part 151 may be disposed to surround the second part 152 of a circular or oval shape.

Figure 6:
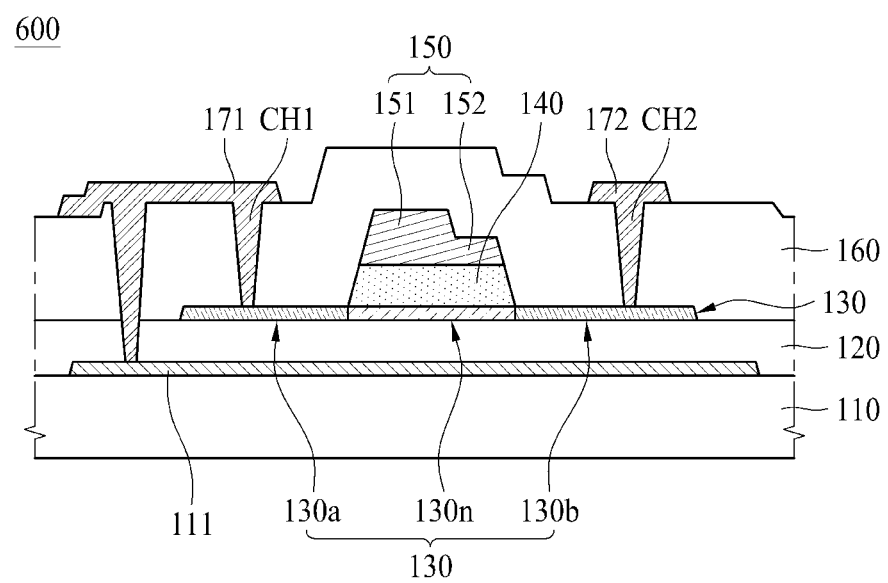
FIG. 6 is a cross-sectional view illustrating a thin film transistor according to another example of the present disclosure.

FIG. 6 is a cross-sectional view illustrating a thin film transistor 600 according to further still another embodiment of the present disclosure.

Referring to FIG. 6, a light shielding layer 111 may be disposed on the substrate 110. The light shielding layer 111 may be made of a material having light shielding characteristics. The light shielding layer 111 shields the active layer 130 from light to thereby protect the active layer 130.

Referring to FIG. 6, the buffer layer 120 may be disposed on the light shielding layer 111. Although not shown in FIG. 6, a lower buffer layer may be disposed between the substrate 110 and the light shielding layer 111.

Referring to FIG. 6, the light shielding layer 111 may be connected to the first electrode 171 through a contact hole formed in the buffer layer 120 and the interlayer insulating layer 160, but further still another embodiment of the present disclosure is not limited thereto. The light shielding layer 111 may be connected to the first electrode 172, or may be connected to another line or ground portion. The light shielding layer 111 may be in a floating state without being connected to another line as the case may be.

In the thin film transistors 100, 200, 300, 400 and 500 shown in FIGS. 1A, 1B, 2, 3, 4A, 4B and 5, the light shielding layer 111 may be disposed on the substrate 110, and the buffer layer 120 may be disposed on the light shielding layer 111.

Figure 7:
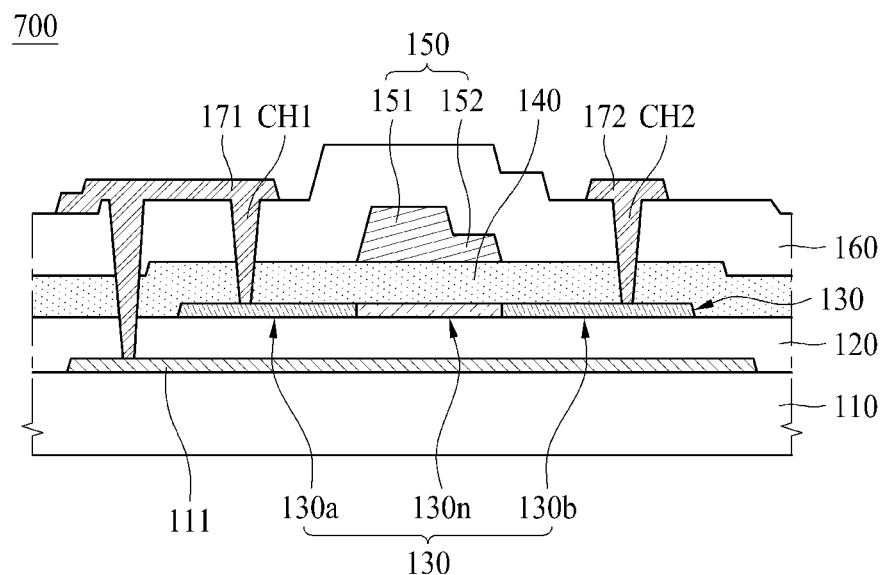
FIG. 7 is a cross-sectional view illustrating a thin film transistor according to another example of the present disclosure.

FIG. 7 is a cross-sectional view illustrating a thin film transistor 700 according to further still another embodiment of the present disclosure.

The thin film transistor 700 of FIG. 7 includes a gate insulating layer 140 that is not patterned. As shown in FIGS. 1B and 6, the gate insulating layer 140 may be patterned to correspond to the gate electrode 150, but as shown in FIG. 7, the gate insulating layer 140 may not be patterned.

When the gate insulating layer 140 is not patterned, the active layer 130 may be selectively made conductive by selective ion doping, selective hydrogen injection or selective ultraviolet irradiation, so that the first connection portion 130a and the second connection portion 130b may be formed. In addition, contact holes CH1 and CH2 passing through the gate insulating layer 140 may be formed.

Figure 8:
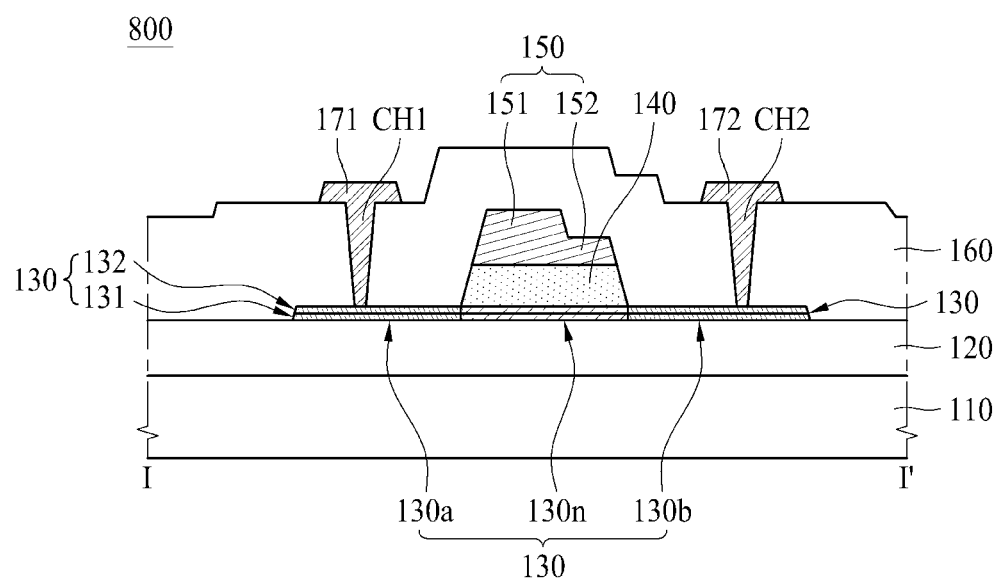
FIG. 8 is a cross-sectional view illustrating a thin film transistor according to another example of the present disclosure.

FIG. 8 is a cross-sectional view illustrating a thin film transistor 800 according to further still another embodiment of the present disclosure.

According to further still another embodiment of the present disclosure, the active layer 130 of the thin film transistor 800 may have a multi-layered structure. Referring to FIG. 8, the active layer 130 may include a first oxide semiconductor layer 131 and a second oxide semiconductor layer 132 on the first oxide semiconductor layer 131.

The first oxide semiconductor layer 131 may support the second oxide semiconductor layer 132. Therefore, the first oxide semiconductor layer 131 may be referred to as a "support layer". The channel portion 130n may be mainly formed in the second oxide semiconductor layer 132. Therefore, the second oxide semiconductor layers 132 may be referred to as a "channel layer", but one embodiment of the present disclosure is not limited thereto, and the channel portion 130n may be also formed on the first oxide semiconductor layer 131.

A structure in which the active layer 130 includes a first oxide semiconductor layer 131 and a second oxide semiconductor layer 132 is referred to as a bi-layer structure.

Figure 9:
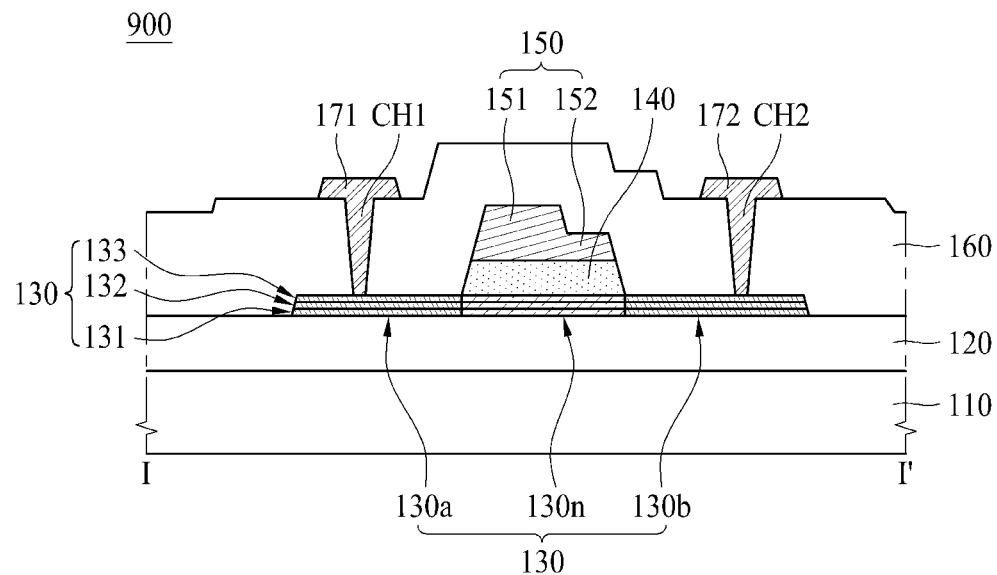
FIG. 9 is a cross-sectional view illustrating a thin film transistor according to another example of the present disclosure.

FIG. 9 is a cross-sectional view illustrating a thin film transistor 900 according to further still another embodiment of the present disclosure.

In the thin film transistor 900 of FIG. 9, the active layer 130 further includes a third oxide semiconductor layer 133 on the second oxide semiconductor layer 132, in comparison with the thin film transistor 800 of FIG. 8.

Referring to FIG. 9, the active layer 130 includes a first oxide semiconductor layer 131, a second oxide semiconductor layer 132, and a third oxide semiconductor layer 133, but further still another embodiment of the present disclosure is not limited thereto, and the active layer may further include another semiconductor layer. With three oxide semiconductor layers, the middle layer is protected from damage during manufacture in both directions, for example the bottom oxide semiconductor layer protects the middle semiconductor layer from gases during manufacture, and the top oxide semiconductor layer protects the middle semiconductor layer from etchant or gases during manufacture.

Figure 10:
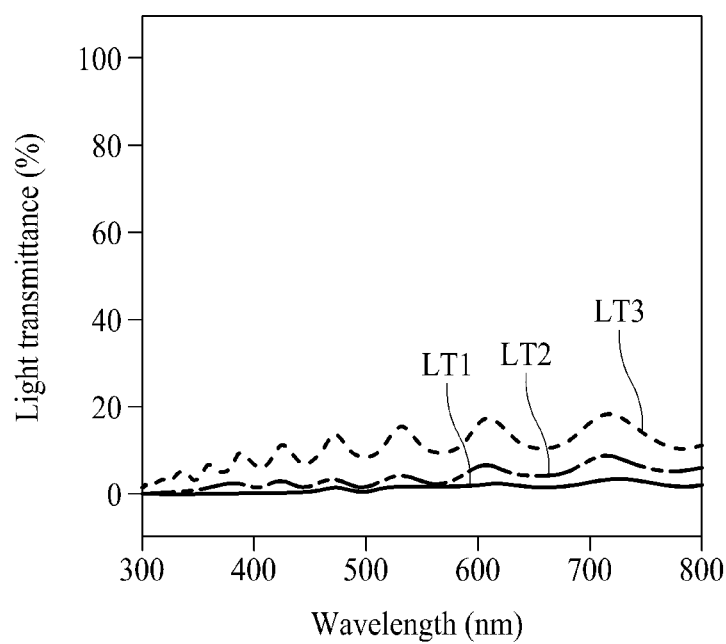
FIG. 10 is a graph illustrating light transmittance of a metal and an alloy based on a thickness and a wavelength.

FIG. 10 is a graph illustrating light transmittance of a metal and an alloy based on a thickness and a wavelength.

In FIG. 10, "LT1" denotes light transmittance according to a wavelength of a molybdenum titanium alloy (MoTi) having a thickness of 60 nm, "LT2" denotes light transmittance according to a wavelength of molybdenum (Mo) having a thickness of 30 nm, and "LT3" denotes light transmittance according to a wavelength of a molybdenum titanium alloy (MoTi) having a thickness of 30 nm.

Referring to FIG. 10, it is noted that light transmittance varies depending on a type of a metal, a type of an alloy and a thickness of the metal or alloy.

According to one embodiment of the present disclosure, the thickness of the second part 152 of the gate electrode 150 may be determined depending on the type of the metal or alloy and the degree of deterioration of reliability of the thin film transistor by the electron trap.

Figure 11:
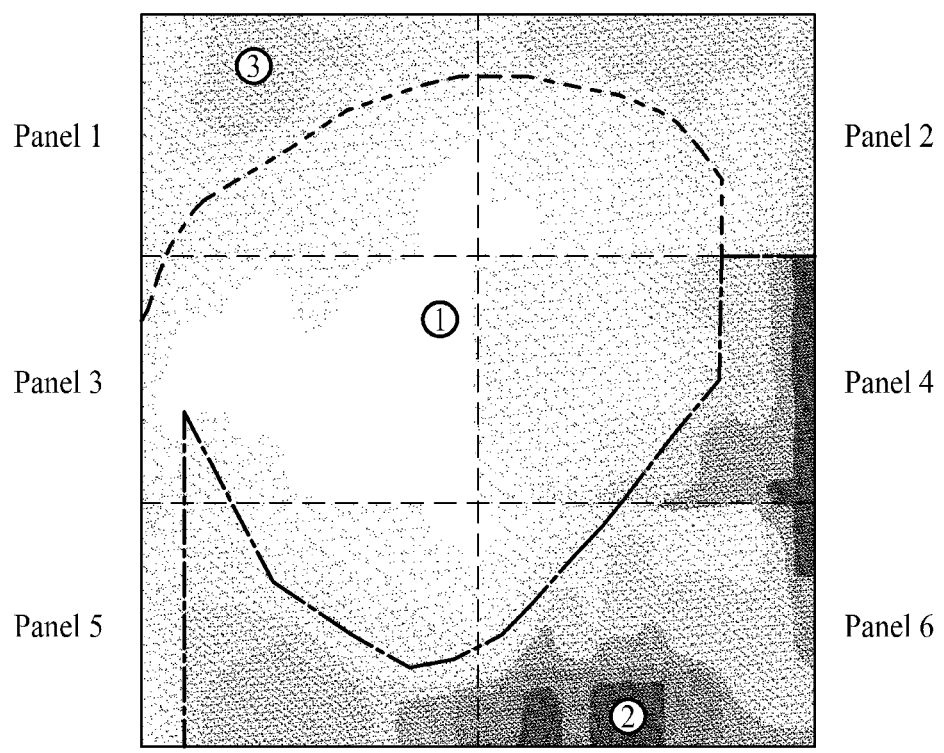
FIG. 11 is a plan view illustrating a mother panel according to another embodiment of the present disclosure.

FIG. 11 is a plan view illustrating a mother panel 1000 according to another embodiment of the present disclosure.

According to one embodiment of the present disclosure, one panel having a plurality of display panels is referred to as a mother panel. A display panel constituting a display device is generally fabricated in one large mother substrate.

When a plurality of display panels are fabricated in one large mother substrate, the mother panel may be formed. The mother panel is cut to form each display panel.

In a fabricating process of a display panel using a large-sized mother substrate, a plurality of thin film transistors are formed on the mother substrate. In order to form a large number of thin film transistors on the large-sized mother substrate, a large-sized deposition apparatus is used, and a process such as exposure and etching is performed for a large area. As a result, a process deviation may be generated for each area of the mother substrate. Due to this process deviation, the degree of electron trap may vary for each thin film transistor.

FIG. 11 illustrates an embodiment of the case that one mother panel 1000 includes six display panels Panel 1, Panel 2, Panel 3, Panel 4, Panel 5 and Panel 6. In FIG. 11, an area represented by "①" refers to a first area having low reliability of an element, an area represented by "②" refers to a second area having high reliability of an element, and an area represented by "③" refers to a third area having middle-level reliability of an element.

According to another embodiment of the present disclosure, the degree of reliability may be determined based on the density of the electron trap generated in the thin film transistor. An area having a high density of the electron trap may be classified into a first area (area ①) having low reliability, an area having a low density of the electron trap may be classified into a second area (area ②) having high reliability, and an area having a middle-level density of the electron trap may be classified into a third area (area ③) having middle-level reliability.

Since a problem of the electron trap in the thin film transistor occurs in the first area (area ①) having low reliability, the second part 152 may be formed in the gate electrode 150. As the electron trap becomes serious, the area of the second part 152 may be larger or the second part 152 may be formed to be thin.

In the second area (area ②) having high reliability, since the problem of the electron trap in the thin film transistor is not large, the second part 152 may not be formed in the gate electrode 150.

In the third area (area ③) having middle-level reliability, the problem of the electron trap occurs in the thin film transistor but the degree of the electron trap is not large. Therefore, the second part 152 may be formed in the gate electrode 150 to have a small area, or the second part 152 may be formed to be thick.

Figure 12A:
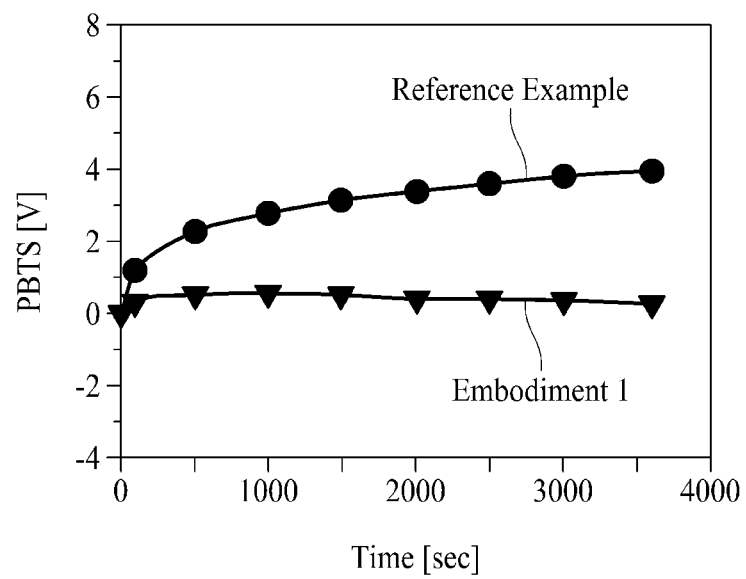
FIG. 12A is a result of PBTS measurement of a thin film transistor.
Figure 12B:
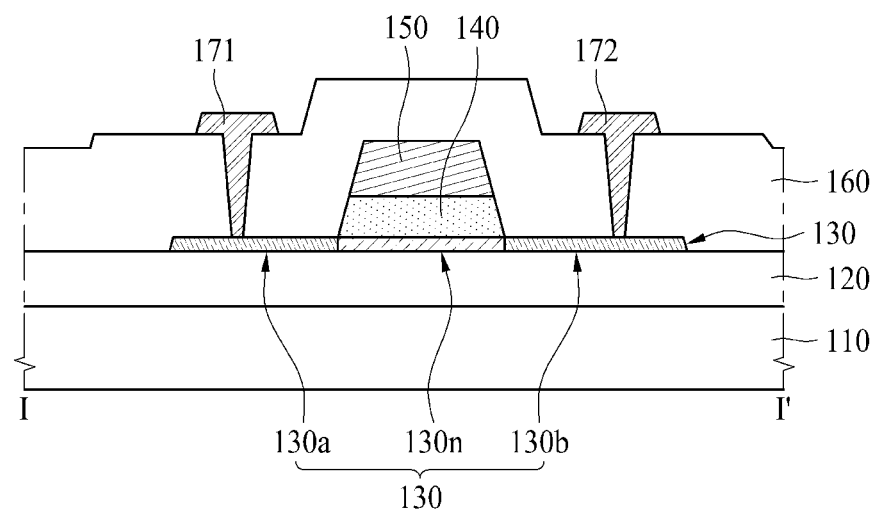
FIG. 12B is a cross-sectional view illustrating a thin film transistor according to a reference example.

FIG. 12A is a result of PBTS measurement of a thin film transistor, and FIG. 12B is a cross-sectional view illustrating a thin film transistor according to a reference example.

In detail, FIG. 12A is a result of PBTS measurement of thin film transistors disposed in the first area (area ①) of the mother panel 1000 shown in FIG. 11. "Embodiment 1" in FIG. 12A shows the result of the PBTS measurement for the thin film transistor 100 having the structure of FIG. 1. In the graph represented by the Embodiment 1, light is transmitted through the second part 152 of the gate electrode 150, so that PBTS is measured under the condition that light is irradiated to a portion of the channel portion 130n.

"Reference Example" in FIG. 12A shows the result of PBTS measured for the thin film transistor according to the Reference Example. As shown in FIG. 12B, the thin film transistor according to the Reference Example has a structure similar to that of FIG. 1, and does not include the second part 152 of the gate electrode 150. The thickness of the gate electrode 150 is the same as that of the first part 151 of FIG. 1.

PBTS (Positive Bias Temperature Stress) refers to stress under the condition that a positive (+) bias voltage and a constant temperature are applied.

According to one embodiment of the present disclosure, the PBTS for the thin film transistor may be evaluated by measuring a variation ΔVth of the threshold voltage of the thin film transistor under the condition that a positive (+) bias voltage and a constant temperature are applied. The PBTS for the thin film transistor may be expressed as a variation ΔVth of the threshold voltage of the thin film transistor under the PBTS condition.

FIG. 12A is a graph illustrating a variation of the threshold voltage of the thin film transistor based on the time (seconds, sec) in a state that temperature stress of 60° C. and a positive (+) bias voltage are applied to the thin film transistor according to the Embodiment 1 and the Reference Example, which is formed in the first area (area ①) of the mother panel 1000.

In the thin film transistor according to the Embodiment 1, light is transmitted through the second part 152 of the gate electrode 150, whereby the light is irradiated to a portion of the channel portion 130n. On the other hand, in the thin film transistor according to the Reference Example, no external light is irradiated to the channel portion 130n.

Referring to FIG. 12A, in the thin film transistor according to the Embodiment 1, which includes the gate electrode 150 having the second part 152, it is noted that the threshold voltage Vth is not changed significantly over time even though the thin film transistor is formed in the first area (area ①) having low reliability among the areas of the mother panel 1000.

On the other hand, in the thin film transistor according to the Reference Example, it is noted that the threshold voltage Vth is changed over time. Referring to FIG. 12A, when the thin film transistor is formed in the first area (area ①) having low reliability, the threshold voltage Vth of the thin film transistor is changed over time, so that reliability of the thin film transistor is deteriorated.

On the other hand, it is noted that the thin film transistor according to one embodiment of the present disclosure has excellent driving stability under the condition of PBTS even though it has been formed in the first area (area ①) having low reliability.

In the thin film transistor that includes an active layer 130 made of an oxide semiconductor, when the electron trap occurs on the interface between the channel portion 130n of the active layer 130 and the gate insulating layer 140, mobility of the thin film transistor 100 may deteriorate so that the threshold voltage may be changed. As shown in the Reference Example of FIG. 12A, when the threshold voltage is changed, it is evaluated that reliability of the thin film transistor is not good.

In the thin film transistor according to the Embodiment 1, light is transmitted through the second part 152 of the gate electrode 150, and the electron trap may be resolved by the transmitted light. As a result, the thin film transistor according to the Embodiment 1 may maintain the threshold voltage Vth to be almost constant as shown in FIG. 12A even though it is used for a long period of time under the worst stress condition.

Another embodiment of the present disclosure provides a mother panel 1000 that may be divided into a plurality of display panels by cutting.

The mother panel 1000 according to another embodiment of the present disclosure may include at least one of the thin film transistors 100, 200, 300, 400, 500, 600, 700, 800 and 900 according to FIGS. 1A, 1B, 2, 3, 4A, 4B, 5, 6, 7, 8 and 9.

In detail, the mother panel 1000 may include a mother substrate having one or more display panels Panel 1, Panel 2, Panel 3, Panel 4, Panel 5 and Panel 6 and a plurality of thin film transistors 100, 200, 300, 400, 500, 600, 700, 800 and 900 disposed on the mother substrate.

The mother substrate includes a first area (area ①) and a second area (area ②), which are distinguished from each other. The first area of the mother substrate corresponds to an area (area ①) having low reliability of an element, and the second area corresponds to an area (area ②) having high reliability of an element. The first area (area ①) of the mother substrate corresponds to the first area of the mother panel 1000, and the second area (area ②) of the mother substrate corresponds to the second area of the mother panel 1000.

Each of the plurality of thin film transistors disposed on the mother substrate includes an active layer 130 and a gate electrode 150. The active layer 130 includes a channel portion 130*n*.

The gate electrode 150 of the thin film transistors 100, 200, 300, 400, 500, 600, 700, 800 and 900 disposed in the first area (area ①) having low reliability of the element may include a first part 151 and a second part 152. The first part 151 at least partially overlaps the channel portion 130*n* of the active layer 130. The second part 152 has a thickness smaller than that of the first part 151, and at least partially overlaps the channel portion 130*n* of the active layer 130. In addition, light transmittance of the second part 152 is greater than that of the first part 151.

The gate electrode 150 of the thin film transistor disposed in the second area (area ②) having high reliability of the element may not include the second part 152. The gate electrode 150 of the thin film transistor disposed in the second area (area ②) may have the same thickness as that of the first part 151. For example, the thin film transistor disposed in the second area (area ②) may have the structure shown in FIG. 12B.

For example, the gate electrode 150 of the thin film transistor disposed in the second area (area ②) of the mother substrate may have the same thickness as that of the first part 151 of the gate electrode 150 of the thin film transistor disposed in the second area without a thickness step profile. In more detail, the entire gate electrode 150 of the thin film transistor disposed in the second area of the mother substrate may have the same thickness as that of the first part 151.

According to another embodiment of the present disclosure, the mother substrate may include a third area (area ③) distinguished from the first area (area ①) and the second area (area ②). The third area (area ③) of the mother substrate corresponds to an area (area ③) having middle-level reliability. The third area (area ③) of the mother substrate corresponds to a third area of the mother panel 1000.

Since the thin film transistor included in the third area (area ③) has middle-level reliability, the area of the second part 152 may be reduced as compared with the thin film transistor included in the first area (area ①).

In detail, the gate electrode 150 of the thin film transistor disposed in the third area (area ③) includes a first part 151 and a second part 152. The first part 151 overlaps at least a portion of the channel portion 130*n* of the active layer 130. The second part 152 has a thickness smaller than that of the first part 151, and at least partially overlaps the channel portion 130*n* of the active layer 130. The gate electrode 150 of the thin film transistors 100, 200, 300, 400, 500, 600, 700, 800 and 900 disposed in the third area (area ③) of the mother substrate may include a first part 151 and a second part 152.

The area of the second part 152 of the gate electrode 150 included in the thin film transistor disposed in the third area (area ③) may be smaller than the area of the second part 152 of the gate electrode 150 included in the thin film transistor disposed in the first area (area ①). Alternatively, the thickness of the second part 152 of the gate electrode 150 included in the thin film transistor disposed in the third area (area ③) may be greater than the thickness of the second part 152 of the gate electrode 150 included in the thin film transistor disposed in the first area (area ①).

For example, the second part 152 of the gate electrode 150 included in the thin film transistor disposed in the third area (area ③) may have a smaller area or a larger thickness as compared with the second part 152 of the gate electrode 150 included in the thin film transistor disposed in the first area (area ①).

Hereinafter, the display devices according to another embodiment of the present disclosure will be described. The display devices according to another embodiment of the present disclosure may include the above-described thin film transistors 100, 200, 300, 400, 500, 600, 700, 800 and 900. The display device may comprise an LED, OLED, LCD, PDP, microLED, or a miniLED display device.

Figure 13:
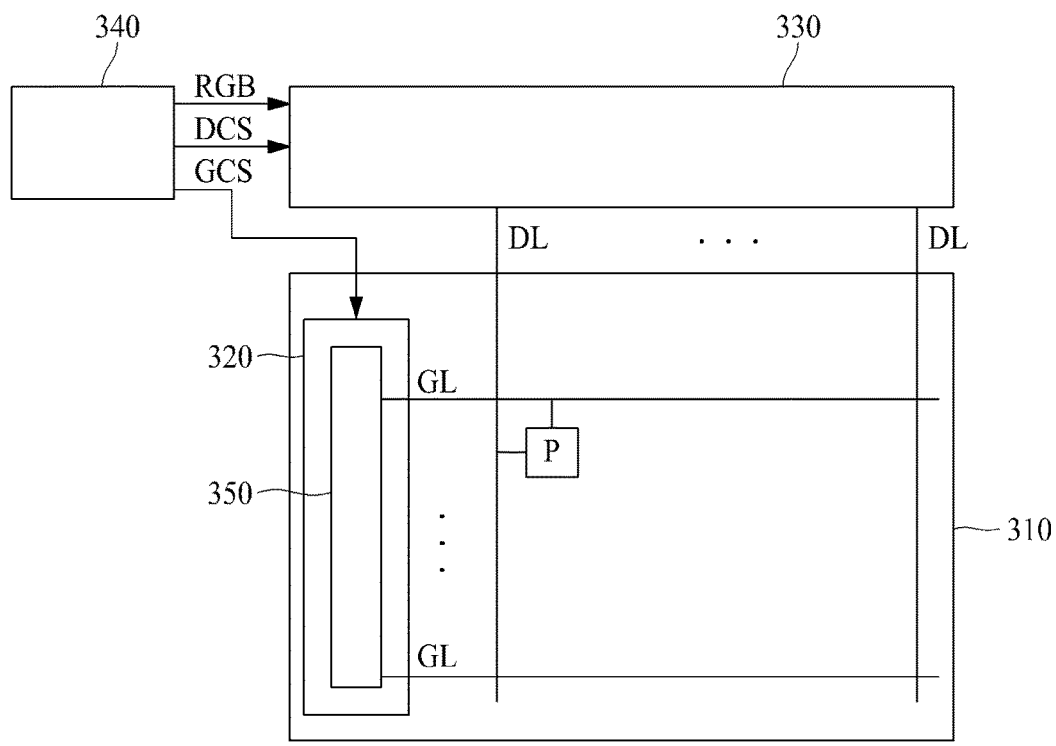
FIG. 13 is a schematic view illustrating a display device according to another example of the present disclosure.

FIG. 13 is a schematic view illustrating a display device 1100 according to further still another embodiment of the present disclosure.

As shown in FIG. 13, the display device 1100 according to further still another embodiment of the present disclosure includes a display panel 310, a gate driver 320, a data driver 330 and a controller 340.

Gate lines GL and data lines DL are disposed in the display panel 310 and pixels P are disposed in intersection areas of the gate lines GL and the data lines DL. An image is displayed by driving of the pixels P.

The controller 340 controls the gate driver 320 and the data driver 330.

The controller 340 outputs a gate control signal GCS for controlling the gate driver 320 and a data control signal DCS for controlling the data driver 330 by using a signal supplied from an external system (not shown). Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst and a gate clock GCLK. Also, control signals for controlling a shift register may be included in the gate control signal GCS.

The data control signal DCS includes a source start pulse SSP, a source shift clock signal SSC, a source output enable signal SOE and a polarity control signal POL.

The data driver 330 supplies a data voltage to the data lines DL of the display panel 310. In detail, the data driver 330 converts the image data RGB input from the controller 340 into an analog data voltage and supplies the data voltage to the data lines DL.

The gate driver 320 may include a shift register 350.

The shift register 350 sequentially supplies gate pulses to the gate lines GL for one frame by using the start signal and the gate clock, which are transmitted from the controller 340. In this case, one frame means a time period when one image is output through the display panel 310. The gate pulse has a turn-on voltage capable of turning on a switching element (thin film transistor) disposed in the pixel P.

Also, the shift register 350 supplies a gate-off signal capable of turning off a switching element, to the gate line GL for the other period of one frame, at which the gate pulse is not supplied. Hereinafter, the gate pulse and the gate-off signal will be collectively referred to as a scan signal SS or Scan.

According to one embodiment of the present disclosure, the gate driver 320 may be packaged on the display panel 310. In this way, a structure in which the gate driver 320 is directly packaged on the display panel 310 will be referred to as a Gate In Panel (GIP) structure.

The gate driver 320 may include a plurality of thin film transistors. The plurality of thin film transistors included in the gate driver 320 may be disposed in the shift register 350.

According to one embodiment of the present disclosure, each of the plurality of thin film transistors disposed in the gate driver 320 includes an active layer 130 and a gate electrode 150. The active layer 130 includes a channel portion 130*n*. The gate electrode 150 of the thin film transistor disposed in the gate driver 320 may include a second part 152 or not. The thin film transistor disposed in the gate driver 320 may have the same structure as that of each of the above-described thin film transistors 100, 200, 300, 400, 500, 600, 700, 800 and 900, or may have the structure shown in FIG. 12B.

For example, the gate electrode 150 of the thin film transistor disposed in the gate driver 320 may have a second part 152, or may have the same thickness as that of the first part 151 of the gate electrode of the thin film transistor disposed in the pixel driving circuit without thickness step profile.

Figure 14:
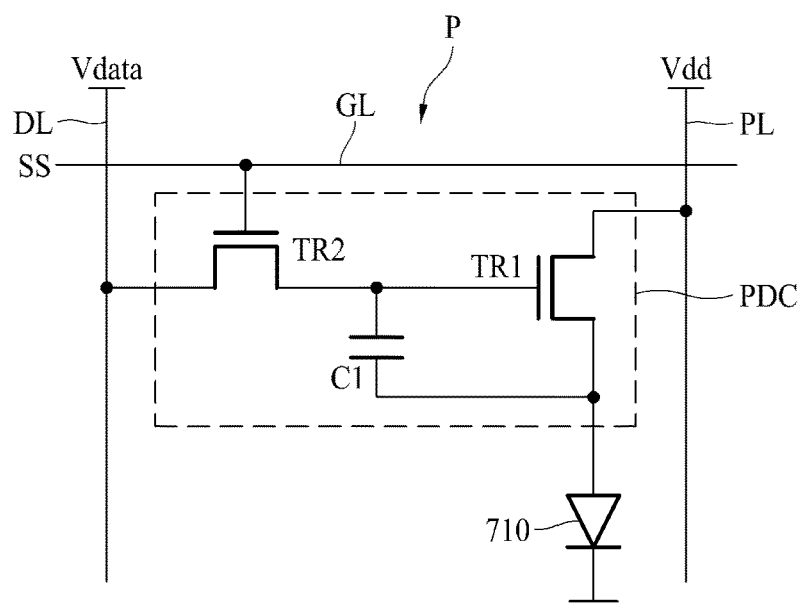
FIG. 14 is a circuit diagram illustrating any one pixel of FIG. 13 according to an embodiment of the present disclosure.
Figure 15:
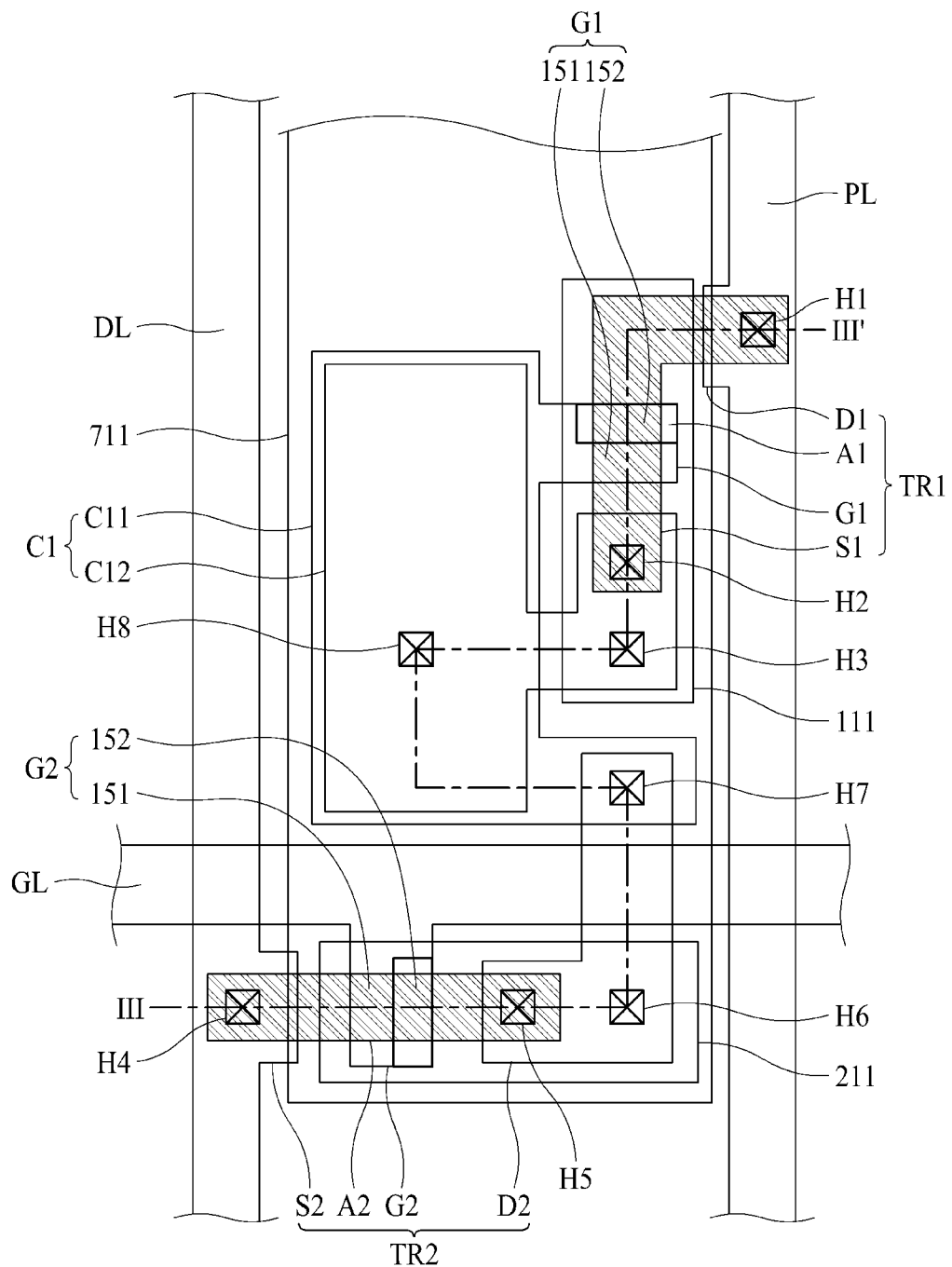
FIG. 15 is a plan view illustrating the pixel of FIG. 14 according to an embodiment of the present disclosure.
Figure 16:
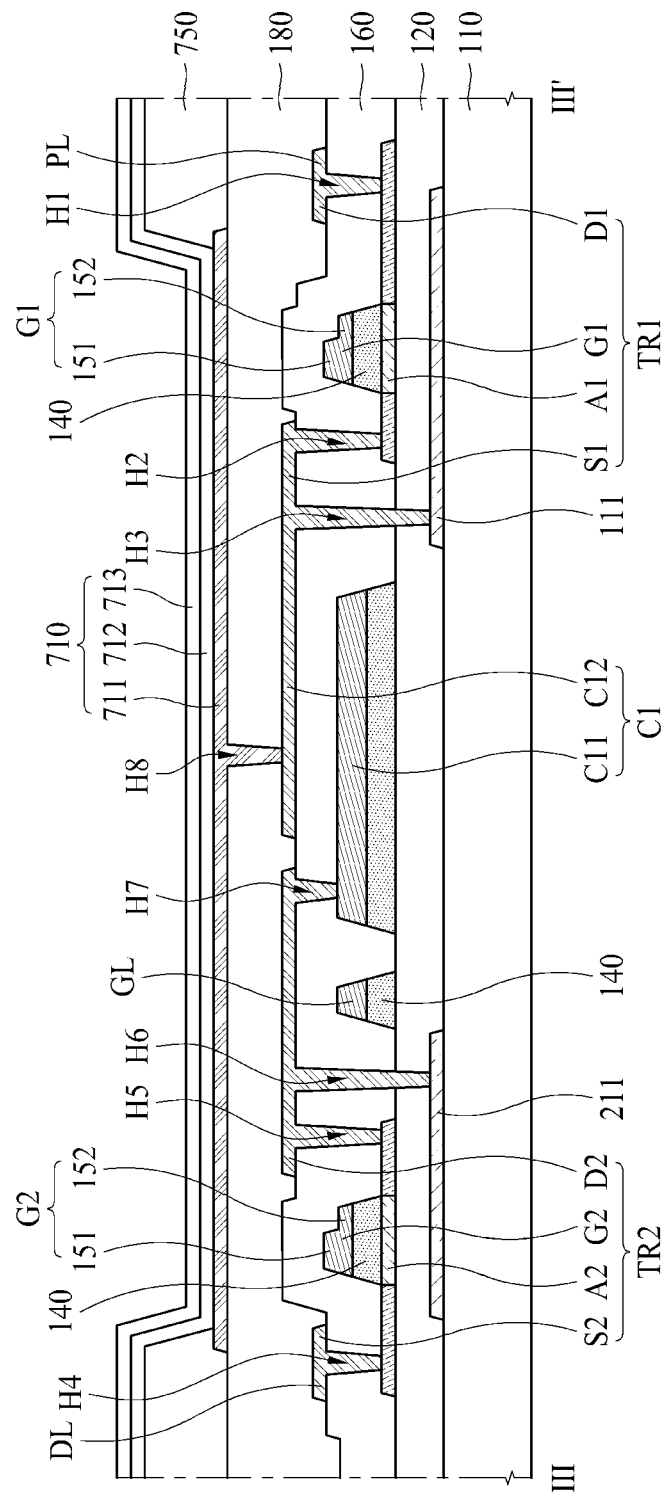
FIG. 16 is a cross-sectional view taken along line III-III' of FIG. 15 according to an embodiment of the present disclosure.

FIG. 14 is a circuit diagram illustrating any one pixel P of FIG. 13, FIG. 15 is a plan view illustrating a pixel P of FIG. 14, and FIG. 16 is a cross-sectional view taken along line III-III' of FIG. 12.

The circuit diagram of FIG. 14 is an equivalent circuit diagram for the pixel P of the display device 1100 that includes an organic light emitting diode (OLED) as a display element 710. The pixel P includes a display element 710 and a pixel driving circuit PDC for driving the display element 710.

According to further still another embodiment of the present disclosure, the display device 1100 includes a plurality of pixels P having a pixel driving circuit PDC. The pixel driving circuit PDC includes a first thin film transistor TR1 and a second thin film transistor TR2. At least one of the above-described thin film transistors 100, 200, 300, 400, 500, 600, 700, 800 and 900 may be used as at least one of the first thin film transistor TR1 or the second thin film transistor TR2.

According to further still another embodiment of the present disclosure, the first thin film transistor TR1 is a driving transistor, and the second thin film transistor TR2 is a switching transistor.

The second thin film transistor TR2 is connected to the gate line GL and the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

A driving power line PL provides a driving voltage Vdd to the display element 710, and the first thin film transistor TR1 controls the driving voltage Vdd. The driving voltage Vdd is a pixel driving voltage for driving the organic light emitting diode (OLED) that is the display element 710.

When the second thin film transistor TR2 is turned on by the scan signal SS applied from the gate driver 320 through the gate line GL, the data voltage Vdata supplied through the data line DL is supplied to a gate electrode G2 of the first thin film transistor TR1 connected with the display element 710. The data voltage Vdata is charged in a storage capacitor C1 formed between the gate electrode G2 and a source electrode S2 of the first thin film transistor TR1.

The amount of a current supplied to the organic light emitting diode (OLED), which is the display element 710, through the first thin film transistor TR1 is controlled in accordance with the data voltage Vdata, whereby a gray scale of light emitted from the display element 710 may be controlled.

Referring to FIGS. 15 and 16, the first thin film transistor TR1 and the second thin film transistor TR2 are disposed on the substrate 110.

The substrate 110 may be made of glass or plastic. Plastic having a flexible property, for example, polyimide (PI) may be used as the substrate 110.

Light shielding layers 111 and 211 are disposed on the substrate 110. The light shielding layers 111 and 211 may shield the active layers A1 and A2 from light to thereby protect the active layers A1 and A2.

A buffer layer 120 is disposed on the light shielding layers 111 and 211. The buffer layer 120 is made of an insulating material, and protects the active layers A1 and A2 from external water or oxygen.

The active layer A1 of the first thin film transistor TR1 and the active layer A2 of the second thin film transistor TR2 are disposed on the buffer layer 120. The active layers A1 and A2 may include, for example, an oxide semiconductor material. The active layers A1 and A2 may be made of an oxide semiconductor layer made of an oxide semiconductor material. The active layers A1 and A2 may have a multi-layered structure.

A gate insulating layer 140 is disposed on the active layers A1 and A2.

A gate electrode G1 of the first thin film transistor TR1 and a gate electrode G2 of the second thin film transistor TR2 are disposed on the gate insulating layer 140.

Both of the gate electrodes G1 and G2 may include a first part 151 and a second part 152. The first part 151 at least partially overlaps the channel portions of the active layers A1 and A2. The second part 152 has a thickness smaller than a thickness of the first part 151, and at least partially overlaps the channel portions of the active layers A1 and A2. Due to the thickness difference between the first part 151 and the second part 152, the gate electrodes G1 and G2 may have a thickness step profile.

Light transmittance of the second part 152 is greater than that of the first part 151.

Also, a gate line GL may be disposed on the gate insulating layer 140. The gate electrode G2 of the second thin film transistor TR2 may be extended from the gate line GL, but one embodiment of the present disclosure is not limited thereto, and a portion of the gate line GL may be the gate electrode G2 of the second thin film transistor TR2.

Referring to FIGS. 15 and 16, a first capacitor electrode C11 of the storage capacitor C1 is disposed in the same layer as the gate electrodes G1 and G2. The first capacitor electrode C11 may be connected to the gate electrode G1 of the first thin film transistor TR1. The first capacitor electrode C11 may be integrally formed with the gate electrode G1 of the first thin film transistor TR1.

An interlayer insulating layer 160 is disposed on the gate electrodes G1 and G2, the gate line GL and the first capacitor electrode C11. The interlayer insulating layer 160 may be made of an organic or inorganic insulating material.

A source electrode S1 and a drain electrode D1 of the first thin film transistor TR1 and a source electrode S2 and a drain electrode D2 of the second thin film transistor TR2 are disposed on the interlayer insulating layer 160. The data line DL, the driving power line PL, and a second capacitor electrode C12 of the storage capacitor C1 may be disposed on the interlayer insulating layer 160.

A portion of the driving power line PL may be extended to become the drain electrode D1 of the first thin film transistor TR1. The drain electrode D1 of the first thin film transistor TR1 is connected to the active layer A1 through a contact hole H1.

The source electrode S1 of the first thin film transistor TR1 may be connected to the active layer A1 through a contact hole H2, and may be connected to the light shielding layer 111 through another contact hole H3.

The source electrode S1 of the first thin film transistor TR1 and the second capacitor electrode C12 are connected to each other. The source electrode S1 of the first thin film transistor TR1 and the second capacitor electrode C12 may be integrally formed.

A portion of the data line DL may be extended to become the source electrode S2 of the second thin film transistor TR2. The source electrode S2 of the second thin film transistor TR2 may be connected to the active layer A2 through a contact hole H4.

A drain electrode D2 of the second thin film transistor TR2 may be connected to the active layer A2 through a contact hole H5, may be connected to the light shielding layer 211 through another contact hole H6, and may be connected to the first capacitor electrode C11 through another contact hole H7.

A planarization layer 180 is disposed on the source electrode S1 and the drain electrode D1 of the first thin film transistor TR1, the source electrode S2 and the drain electrode D2 of the second thin film transistor TR2, the data line DL, the driving power line PL, and the second capacitor electrode C12.

The planarization layer 180 is made of an insulating layer, planarizes upper portions of the first thin film transistor TR1 and the second thin film transistor TR2, and protects the first thin film transistor TR1 and the second thin film transistor TR2.

A first pixel electrode 711 of the display element 710 is disposed on the planarization layer 180. The first pixel electrode 711 is in contact with the second capacitor electrode C12 through a contact hole H8 formed in the planarization layer 180. As a result, the first pixel electrode 711 may be connected to the source electrode S1 of the first thin film transistor TR1.

A bank layer 750 is disposed at an edge of the first pixel electrode 711. The bank layer 750 defines a light emission area of the display element 710.

An organic light emitting layer 712 is disposed on the first pixel electrode 711, and a second pixel electrode 713 is disposed on the organic light emitting layer 712. Therefore, the display element 710 is completed. The display element 710 shown in FIGS. 15 and 16 is an organic light emitting diode OLED. Therefore, the display device 1100 according to further still another embodiment of the present disclosure is an organic light emitting display device.

Figure 17:
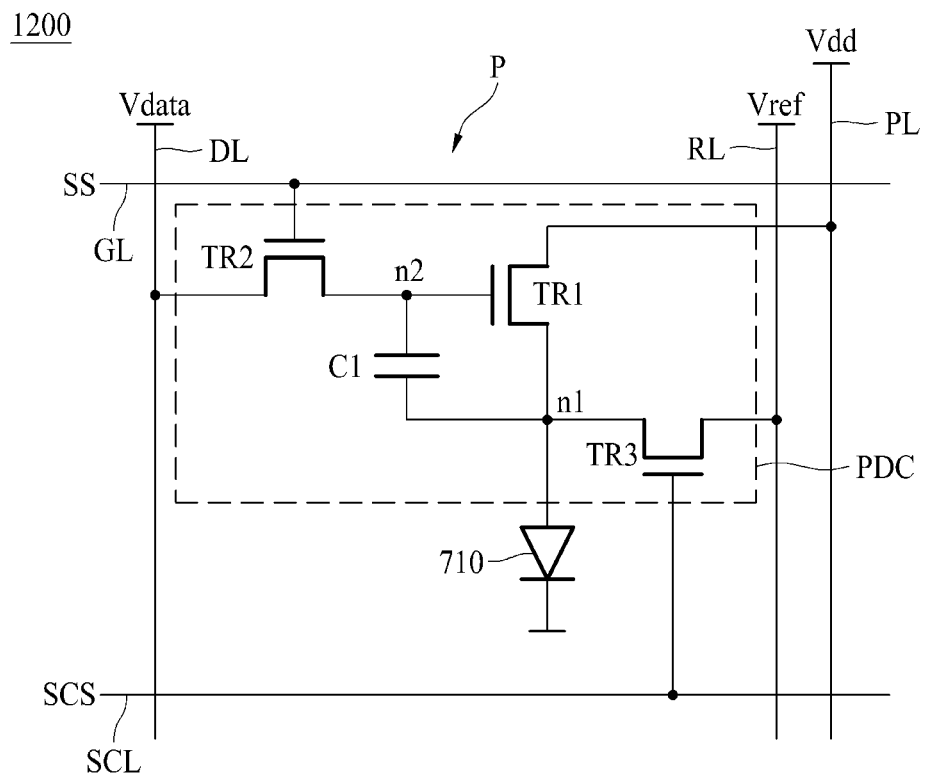
FIG. 17 is a circuit diagram illustrating any one pixel of a display device according to another example of the present disclosure.

FIG. 17 is a circuit diagram illustrating any one pixel P of a display device 1200 according to further still another embodiment of the present disclosure.

FIG. 17 is an equivalent circuit diagram illustrating a pixel P of an organic light emitting display device.

The pixel P of the display device 1200 shown in FIG. 17 includes an organic light emitting diode (OLED) that is a display element 710 and a pixel driving circuit PDC for driving the display element 710. The display element 710 is connected with the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL and a sensing control signal SCS is supplied to a sensing control line SCL.

The pixel driving circuit PDC includes, for example, a second thin film transistor TR2 (switching transistor) connected with the gate line GL and the data line DL, a first thin film transistor TR1 (driving transistor) for controlling a magnitude of a current output to the display element 710 in accordance with the data voltage Vdata transmitted through the second thin film transistor TR2, and a third thin film transistor TR3 (reference transistor) for sensing characteristics of the first thin film transistor TR1.

A storage capacitor C1 is positioned between the gate electrode of the first thin film transistor TR1 and the display element 710.

The second thin film transistor TR2 is turned on by the scan signal SS supplied to the gate line GL to transmit the data voltage Vdata, which is supplied to the data line DL, to the gate electrode of the first thin film transistor TR1.

The third thin film transistor TR3 is connected to a first node n1 between the first thin film transistor TR1 and the display element 710 and the reference line RL, and thus is turned on or off by the sensing control signal SCS and senses characteristics of the first thin film transistor TR1, which is a driving transistor, for a sensing period.

A second node n2 connected with the gate electrode of the first thin film transistor TR1 is connected with the second thin film transistor TR2. The storage capacitor C1 is formed between the second node n2 and the first node n1.

When the second thin film transistor TR2 is turned on, the data voltage Vdata supplied through the data line DL is supplied to the gate electrode of the first thin film transistor TR1. The data voltage Vdata is charged in the storage capacitor C1 formed between the gate electrode and the source electrode of the first thin film transistor TR1.

When the first thin film transistor TR1 is turned on, the current is supplied to the display element 710 through the first thin film transistor TR1 in accordance with the driving voltage Vdd for driving the pixel, whereby light is output from the display element 710.

Figure 18:
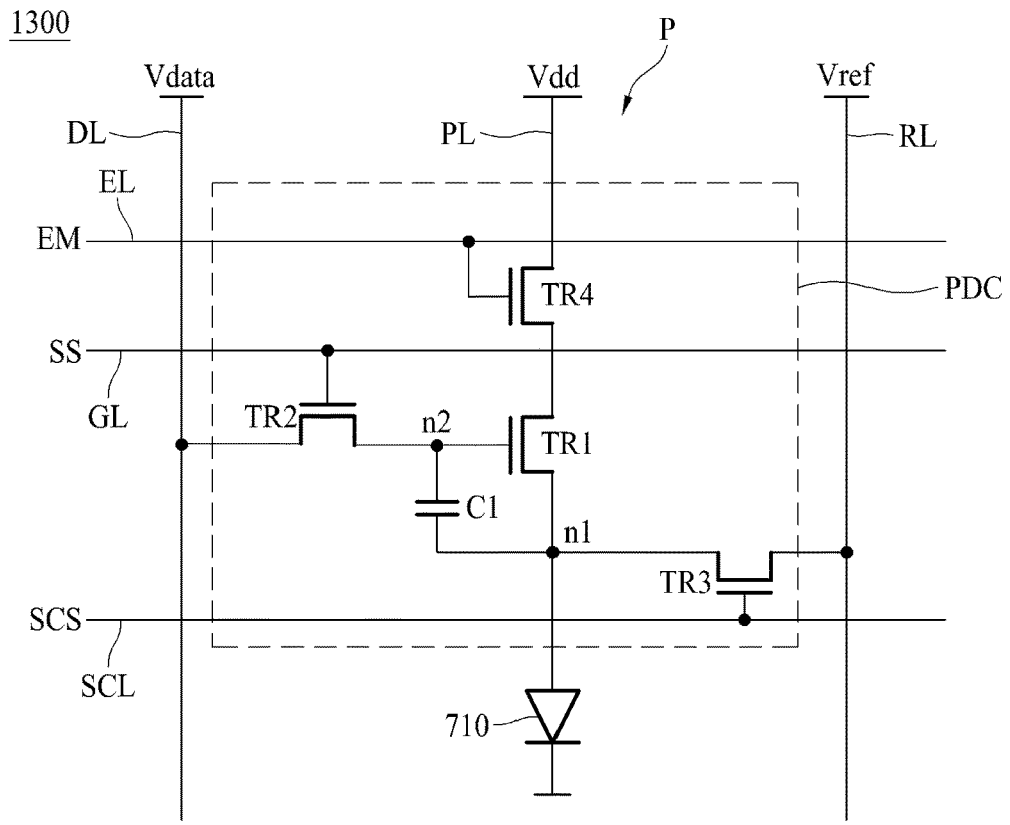
FIG. 18 is a circuit diagram illustrating any one pixel of a display device according to another example of the present disclosure.

FIG. 18 is a circuit diagram illustrating any one pixel of a display device 1300 according to further still another embodiment of the present disclosure.

The pixel P of the display device 1300 shown in FIG. 18 includes an organic light emitting diode (OLED) that is a display element 710 and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying a driving signal to the pixel driving circuit PDC are disposed.

In comparison with the pixel P of FIG. 17, the pixel P of FIG. 18 further includes an emission control line EL. An emission control signal EM is supplied to the emission control line EL.

Also, the pixel driving circuit PDC of FIG. 18 further includes a fourth thin film transistor TR4 that is an emission control transistor for controlling a light emission timing of the first thin film transistor TR1, in comparison with the pixel driving circuit PDC of FIG. 17.

A storage capacitor C1 is positioned between the gate electrode of the first thin film transistor TR1 and the display element 710.

The second thin film transistor TR2 is turned on by the scan signal SS supplied to the gate line GL to transmit the data voltage Vdata, which is supplied to the data line DL, to the gate electrode of the first thin film transistor TR1.

The third thin film transistor TR3 is connected to the reference line RL, and thus is turned on or off by the sensing control signal SCS and senses characteristics of the first thin film transistor TR1, which is a driving transistor, for a sensing period.

The fourth thin film transistor TR4 transfers the driving voltage Vdd to the first thin film transistor TR1 in accordance with the emission control signal EM or shields the driving voltage Vdd. When the fourth thin film transistor TR4 is turned on, a current is supplied to the first thin film transistor TR1, whereby light is output from the display element 710.

The pixel driving circuit PDC according to further still another embodiment of the present disclosure may be formed in various structures in addition to the above-described structure. The pixel driving circuit PDC may include, for example, five or more thin film transistors.

Figure 19:
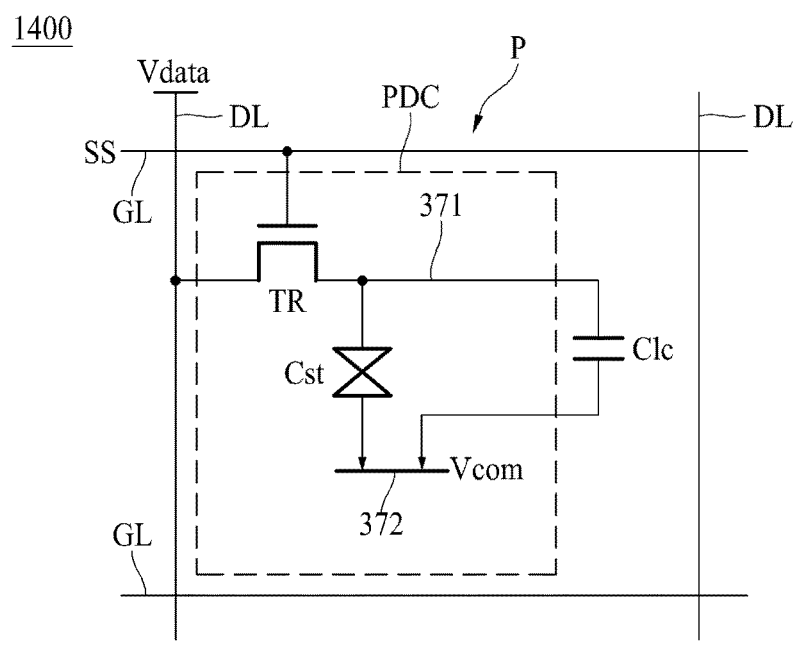
FIG. 19 is a circuit diagram illustrating any one pixel of a display device according to another example of the present disclosure.

FIG. 19 is a circuit diagram illustrating any one pixel of a display device 1400 according to further still another embodiment of the present disclosure.

The display device 1400 of FIG. 19 is a liquid crystal display device. The pixel P of the display device 1400 shown in FIG. 19 includes a pixel driving unit PDC and a liquid crystal capacitor Clc connected to the pixel driving unit PDC. The liquid crystal capacitor Clc corresponds to a display element.

The pixel driving circuit PDC includes a thin film transistor TR connected to the gate line GL and the data line DL, a pixel electrode 371 connected to the thin film transistor TR, a common electrode 372 facing the pixel electrode 371, and a storage capacitor Cst connected between the thin film transistor TR and the common electrode 372. The liquid crystal capacitor Clc is connected between the thin film transistor TR and the common electrode 372 in parallel with the storage capacitor Cst.

The liquid crystal capacitor Clc charges a differential voltage between the data signal supplied to the pixel electrode through the thin film transistor TR and a common voltage Vcom supplied to the common electrode 372, and controls the light-transmissive amount by driving a liquid crystal in accordance with the charged voltage. The storage capacitor Cst stably maintains the voltage charged in the liquid crystal capacitor Clc.

The display device 1400 according to further still another embodiment of the present disclosure may include at least one of the above-described thin film transistors 100, 200, 300, 400, 500, 600, 700, 800 and 900.

Figure 20:
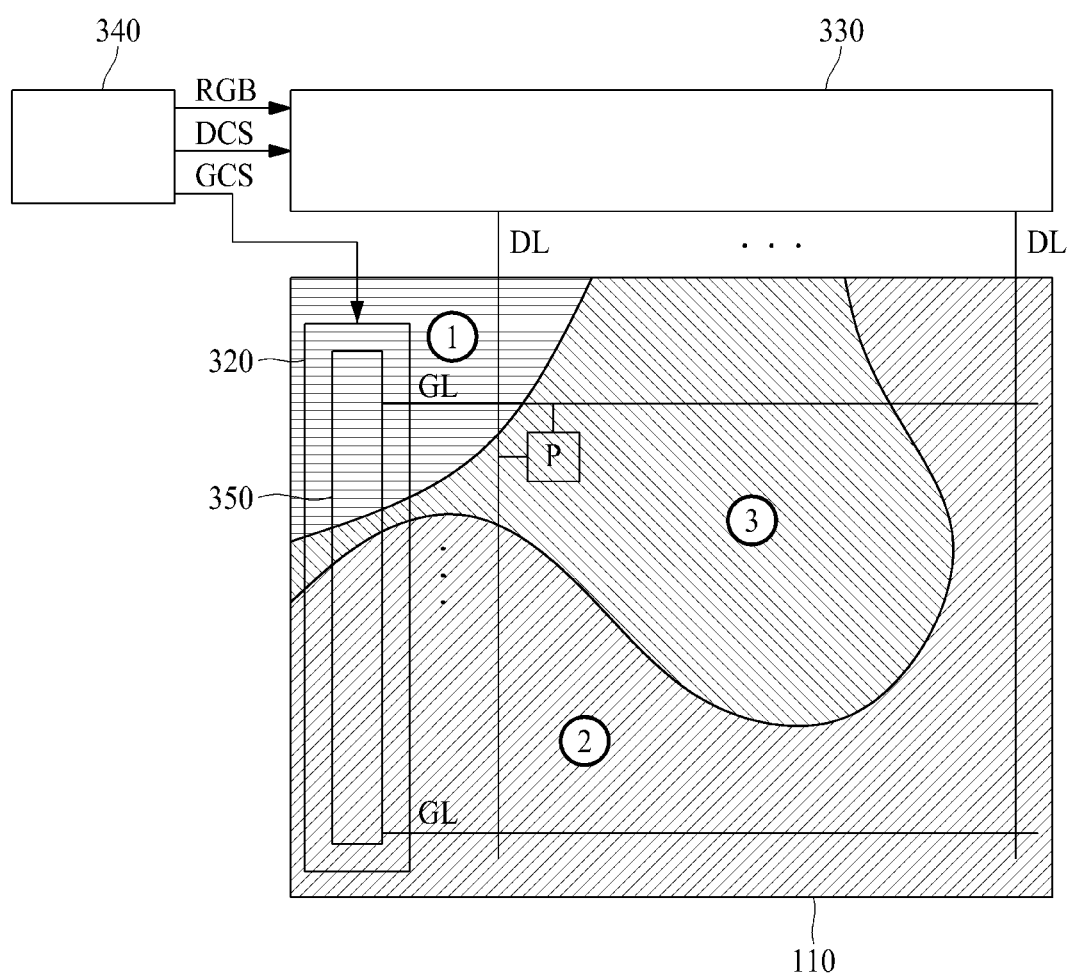
FIG. 20 is a schematic view illustrating a display device according to another example of the present disclosure.

FIG. 20 is a schematic view illustrating a display device 1500 according to further still another embodiment of the present disclosure.

Referring to FIG. 20, the display device 1500 may include a substrate 110, a gate driver 320, a data driver 330 and a controller 340.

The gate lines GL and the data lines DL may be disposed on the substrate 110, and the pixel P may be disposed in the intersection areas of the gate lines GL and the data lines DL to constitute a display panel (not shown, see "310" of FIG. 13). A plurality of pixels P may be disposed on the substrate 110. The pixel P may include a display element 710 and a thin film transistor for driving the display element 710. According to further still another embodiment of the present disclosure, an area of the substrate 110, in which the pixels P are disposed, may be referred to as a display portion. The display panel of the display device 1500 according to further still another embodiment of the present disclosure may correspond to the panel 6 shown in FIG. 11, for example.

Referring to FIG. 20, the gate driver 320 may be disposed on the substrate 110. The gate driver 320 may include a plurality of thin film transistors.

The display device 1500 according to further still another embodiment of the present disclosure may include a substrate 110 and a plurality of thin film transistors on the substrate 110.

As already described above, each of the plurality of thin film transistors may include an active layer 130 having a channel portion 130n and a gate electrode 150 spaced apart from the active layer 130.

The substrate 110 includes a first area (area ①). The first area (area ①) of the substrate 110 may correspond to a first area having low reliability in the mother panel 1000 of FIG. 12.

A thin film transistor may be disposed in the first area (area ①) of the substrate 110. At least one of the above-described thin film transistors 100, 200, 300, 400, 500, 600, 700, 800 and 900 may be applied to the thin film transistor disposed in the first area (area ①) of the substrate 110.

In detail, the gate electrode 150 of the thin film transistors 100, 200, 300, 400, 500, 600, 700, 800 and 900 disposed in the first area (area ①) of the substrate 110 may include a first part 151 that at least partially overlaps the channel portion 130n of the active layer 130, and a second part 152 having a thickness smaller than a thickness of the first part 151. The second part 152 at least partially overlaps the channel portion 130n of the active layer 130. In addition, light transmittance of the second part 152 is greater than light transmittance of the first part 151. Hereinafter, a detailed description of the structure of the thin film transistor will be omitted to avoid redundancy.

According to further still another embodiment of the present disclosure, at least a portion of the gate driver 320 may be positioned in the first area (area ①) of the substrate 110, and at least a portion of the thin film transistor included in the gate driver 320 may be disposed in the first area (area ①). Therefore, the gate driver 320 may include at least one of the thin film transistors 100, 200, 300, 400, 500, 600, 700, 800 and 900 according to FIGS. 1A, 1B, 2, 3, 4A, 4B, 5, 6, 7, 8 and 9.

A portion of the plurality of pixels P disposed on the substrate 110 may be disposed in the first area (area ①) of the substrate 110. Therefore, at least a portion of the pixels P may include at least one of the thin film transistors 100, 200, 300, 400, 500, 600, 700, 800 and 900 according to FIGS. 1A, 1B, 2, 3, 4A, 4B, 5, 6, 7, 8 and 9.

Referring to FIG. 20, the substrate 110 may include a second area (area ②) that is distinguished from the first area (area ①). The second area (area ②) of the substrate 110 may correspond to a second area having high reliability in the mother panel 1000 of FIG. 11.

The gate electrode of the thin film transistor disposed in the second area (area ②) may have the same height as that of the first part 151 without a thickness difference. For example, a thin film transistor having the structure shown in FIG. 12B may be applied to the thin film transistor disposed in the second area (area ②).

According to further still another embodiment of the present disclosure, at least a portion of the gate driver 320 may be included in the second area (area ②) of the substrate 110. Therefore, a portion of the gate driver 320 may include a thin film transistor having the structure shown in FIG. 12B.

A portion of the plurality of pixels P disposed on the substrate 110 may be disposed in the second area (area ②) of the substrate 110. Therefore, at least a portion of the pixels P may include a thin film transistor having the structure shown in FIG. 12B.

The substrate 110 may also include a third area (area ③) that is distinguished from the first area (area ①) and the second area (area ②). The third area (area ③) of the substrate 110 may correspond to a third area having middle-level reliability in the mother panel 1000 of FIG. 11.

The gate electrode of the thin film transistor disposed in the third area (area ③) may include a first part 151 that at least partially overlaps the channel portion 130n of the active layer 130, and a second part 152 having a thickness smaller than a thickness of the first part 151. The second part 152 at least partially overlaps the channel portion 130n of the active layer 130. In addition, light transmittance of the second part 152 may be greater than light transmittance of the first part 151.

The area of the second part 152 of the gate electrode 150 included in the thin film transistor disposed in the third area (area ③) may be smaller than that of the second part 152 of the gate electrode 150 included in the thin film transistor disposed in the first area (area ①).

The thickness of the second part 152 of the gate electrode 150 included in the thin film transistor disposed in the third area (area ③) may be greater than a thickness of the second part 152 of the gate electrode 150 included in the thin film transistor disposed in the first area (area ①).

For example, the second part 152 of the gate electrode 150 included in the thin film transistor disposed in the third area (area ③) may have a smaller area or a larger thickness than that of the second part 152 of the gate electrode 150 included in the thin film transistor disposed in the first area (area ①).

According to further still another embodiment of the present disclosure, at least a portion of the gate driver 320 may be included in the third area (area ③) of the substrate 110. Therefore, the gate driver 320 may include at least one of the thin film transistors 100, 200, 300, 400, 500, 600, 700, 800 and 900 according to FIGS. 1A, 1B, 2, 3, 4A, 4B, 5, 6, 7, 8 and 9.

In the thin film transistor disposed in the third area (area ③) among the thin film transistors of the gate driver 320, the second part 152 of the gate electrode 150 may have a smaller area or a larger thickness than that of the second part 152 of the gate electrode 150 included in the thin film transistor disposed in the first area (area ①).

A portion of the plurality of pixels P disposed on the substrate 110 may be disposed in a third area (area ③) of the substrate 110. Therefore, at least a portion of the pixels P may include at least one of the thin film transistors 100, 200, 300, 400, 500, 600, 700, 800 and 900 according to FIGS. 1A, 1B, 2, 3, 4A, 4B, 5, 6, 7, 8 and 9.

In the thin film transistor of the pixel P disposed in the third area (area ③), the second part 152 of the gate electrode 150 may have a smaller area or a larger thickness than that of the second part 152 of the gate electrode 150 included in the thin film transistor disposed in the first area (area ①).

According to the present disclosure, the following advantageous effects may be obtained.

The thin film transistor according to one embodiment of the present disclosure includes a gate electrode having a first part having a relatively large thickness and a second part having a relatively small thickness. According to one embodiment of the present disclosure, light is transmitted through the second part of the gate electrode and the electron trap of the active layer is resolved by the transmitted light, whereby reliability of the thin film transistor may be prevented from being deteriorated.

According to one embodiment of the present disclosure, light is transmitted through the second part of the gate electrode having a small thickness, and the transmitted light is irradiated to the interface between the active layer and the gate insulating layer, whereby the electron trap on the interface between the active layer and the gate insulating layer may be resolved. As a result, the threshold voltage of the thin film transistor may be prevented from being changed.

In detail, according to one embodiment of the present disclosure, the variation of the threshold voltage of the thin film transistor may be avoided or minimized under the condition of positive (+) bias temperature stress (PBTS) in which a positive (+) bias voltage and a constant temperature are applied.

The display device according to one embodiment of the present disclosure may include the above-described thin film transistor, thereby preventing display quality from being deteriorated over time to maintain excellent display quality.

It will be apparent to those skilled in the art that the present disclosure described above is not limited by the above-described embodiments and the accompanying drawings and that various substitutions, modifications and variations can be made in the present disclosure without departing from the or scope of the disclosures. Consequently, the scope of the present disclosure is defined by the accompanying claims and it is intended that all variations or modifications derived from the meaning, scope and equivalent concept of the claims fall within the scope of the present disclosure.

Following are some further example embodiments of the invention. These are presented only by way of example and are not intended to limit the scope of the invention in any way. Further, any example embodiment can be combined with one or more of the other example embodiments.

1. In one aspect, a thin film transistor includes an active layer having a channel portion, and a gate electrode that overlaps the channel portion of the active layer, wherein the gate electrode includes a first part that at least partially overlaps the channel portion; and a second part having a thickness smaller than that of the first part, at least partially overlapping the channel portion, and light transmittance of the second part is greater than that of the first part.

2. In one aspect, the thin film transistor of clause 1, wherein the second part has light transmittance of 5% to 70%.

3. In one aspect, the thin film transistor of clause 1 or 2, wherein the first part and the second part are made of a same material.

4. In one aspect, the thin film transistor of any preceding clause, wherein the first part has a thickness of 100 nm or more.

5. In one aspect, the thin film transistor of any preceding clause, wherein the second part has a thickness of 5% to 50% relative to the thickness of the first part.

6. In one aspect, the thin film transistor of any preceding clause, wherein the second part has a thickness of 10 nm to 50 nm.

7. In one aspect, the thin film transistor of any preceding clause, wherein, based on a plan view, a ratio of an area occupied by the second part to a total area where the channel portion and the gate electrode overlap each other is in the range of 10% to 60%.

8. In one aspect, the thin film transistor of any preceding clause, wherein the gate electrode has an area transmittance coefficient (ATC) of 1% to 10%, and the area transmittance coefficient (ATC) is calculated by Equation 1 below:

$$ATC[\%] = T \times A, \quad \quad [\text{Equation 1}]$$

in the Equation 1, T is light transmittance of the second part, which is represented by %, and the light transmittance is average light transmittance measured in the range of 360 nm to 740 nm, and A is an area ratio of the second part, which is calculated by Equation 2 below:

$$A = (\text{area of the second part that overlaps the channel portion})/(\text{area of the gate electrode that overlaps the channel portion}). \quad [\text{Equation 2}]$$

9. In one aspect, the thin film transistor of any preceding clause, wherein the second part has a circular shape, an oval shape, a semi-circular shape, a semi-oval shape, or a polygonal plane, in a plan view.

10. In one aspect, the thin film transistor of any preceding clause, wherein the first part is positioned on one side of the gate electrode, and the second part is positioned on the other side of the gate electrode.

11. In one aspect, the thin film transistor of any preceding clause, wherein the first part surrounds the second part.

12. In one aspect, the thin film transistor of any preceding clause, wherein the gate electrode includes at least one of molybdenum (Mo) or titanium (Ti).

13. In one aspect, the thin film transistor of any preceding clause, wherein the active layer includes at least one of an IGZO(InGaZnO)-based oxide semiconductor material, a GZO(GaZnO)-based oxide semiconductor material, an IGO (InGaO)-based oxide semiconductor material, an IGZTO (InGaZnSnO)-based oxide semiconductor material, a GZTO (GaZnSnO)-based oxide semiconductor material, an IZO (InZnO)-based oxide semiconductor material, an ITZO (InSnZnO)-based oxide semiconductor material, a FIZO (FeInZnO)-based oxide semiconductor material, a ZnO-based oxide semiconductor material, a SIZO(SiInZnO)-based oxide semiconductor material or a ZnON(Zn-Oxynitride)-based oxide semiconductor material.

14. In one aspect, the thin film transistor of any preceding clause, wherein the active layer includes: a first oxide semiconductor layer; and a second oxide semiconductor layer on the first oxide semiconductor layer.

15. In one aspect, the thin film transistor of clause 14, wherein the active layer further includes a third oxide semiconductor layer on the second oxide semiconductor layer.

16. In one aspect, the a mother panel includes a mother substrate having one or more display panel areas; and a plurality of thin film transistors disposed on the mother substrate, wherein the mother substrate has a first area and a second area, which are distinguished from each other, each of the plurality of thin film transistors includes an active layer and a gate electrode, the active layer includes a channel portion, a gate electrode of a thin film transistor disposed in the first area includes a first part that at least partially overlaps the channel portion of the active layer; and a second part having a thickness smaller than a thickness of the first part and at least partially overlapping the channel portion of the active layer, and light transmittance of the second part is greater than light transmittance of the first part.

17. In one aspect, the mother panel of clause 16, wherein the gate electrode of the thin film transistor disposed in the second area has a same height as that of the first part without a thickness step difference.

18. In one aspect, the mother panel of clause 16 or 17, wherein the mother substrate has a third area distinguished from the first area and the second area, a gate electrode of the thin film transistor disposed in the third area includes: a first part that at least partially overlaps the channel portion of the active layer, and a second part having a thickness smaller than a thickness of the first part and at least partially overlapping the channel portion of the active layer, and wherein the second part of the gate electrode included in the thin film transistor disposed in the third area has a smaller area or a larger thickness than that of the second part of the gate electrode included in the thin film transistor disposed in the first area.

19. In one aspect, the a display device includes a plurality of pixels having a pixel driving circuit, wherein the pixel driving circuit includes a thin film transistor of any one of claims 1 to 15.

20. In one aspect, the display device of clause 19, further including a gate driver disposed on a substrate, the gate driver including a plurality of thin film transistors, wherein each of the plurality of thin film transistors of the gate driver includes an active layer and a gate electrode, the gate electrode of the thin film transistor disposed in the gate driver has the same thickness as the thickness of a first part of the gate electrode of the thin film transistor disposed in the pixel driving circuit without a thickness step difference.

21. In one aspect, the a display device includes a substrate, and a plurality of thin film transistors on the substrate, wherein each of the plurality of thin film transistors includes an active layer having a channel portion and a gate electrode spaced apart from the active layer, the substrate includes a first area, the gate electrode of the thin film transistor disposed in the first area includes a first part that at least partially overlaps the channel portion of the active layer; and a second part having a thickness smaller than a thickness of the first part and at least partially overlapping the channel portion of the active layer, and wherein light transmittance of the second part is greater than light transmittance of the first part.

22. In one aspect, the display device of clause 21, further including a gate driver disposed on the substrate, wherein the gate driver includes a plurality of thin film transistors, and at least a portion of the thin film transistors included in the gate driver is disposed in the first area.

23. In one aspect, the display device of clause 21 or 22, further including a plurality of pixels disposed on the substrate, wherein each of the plurality of pixels includes a thin film transistor, and at least a portion of the plurality of pixels is disposed in the first area.

24. In one aspect, the display device of any of clauses 21 to 23, wherein the substrate further includes a second area distinguished from the first area, and the gate electrode of the thin film transistor disposed in the second area has a same height as the height of the first part without a thickness difference.

25. In one aspect, the display device of any of clauses 21 to 24, wherein the substrate further includes a third area distinguished from the first area, a gate electrode of the thin film transistor disposed in the third area includes: a first part that at least partially overlaps the channel portion of the active layer; and a second part having a thickness smaller than the first part and at least partially overlapping the channel portion of the active layer, and the second part of the gate electrode included in the thin film transistor disposed in the third area has a smaller area or a larger thickness than that of the second part of the gate electrode included in the thin film transistor disposed in the first area.

26. In one aspect, the display device of clause 25, further including a gate driver disposed on the substrate, wherein the gate driver includes a plurality of thin film transistors, and at least a portion of the thin film transistors included in the gate driver is disposed in the third area.

27. In one aspect, the display device of clause 25 or 26, further including a plurality of pixels disposed on the substrate, wherein each of the plurality of pixels includes a thin film transistor, and at least a portion of the plurality of pixels is disposed in the third area.

What is claimed is:

1. A display device comprising:
a substrate; and
a plurality of thin film transistors on the substrate,
wherein each of the plurality of thin film transistors includes an active layer having a channel portion and a gate electrode spaced apart from the active layer,
the substrate includes a first area,
the gate electrode of a thin film transistor among the plurality of thin film transistors disposed in the first area includes:
a first part that at least partially overlaps the channel portion of the active layer; and
a second part having a thickness smaller than that of the first part and at least partially overlapping the channel portion of the active layer,
wherein light transmittance of the second part is greater than light transmittance of the first part, and
wherein, based on a plan view, a ratio of an area occupied by the second part to a total area where the channel portion and the gate electrode overlap each other is in a range from 10% to 60%.

2. The display device of claim 1, wherein the second part has light transmittance of 5% to 70%.

3. The display device of claim 1, wherein the first part and the second part are made of a same material.

4. The display device of claim 1, wherein the first part has a thickness of 100 nm or more.

5. The display device of claim 1, wherein the second part has a thickness of 5% to 50% relative to the thickness of the first part.

6. The display device of claim 1, wherein the second part has a thickness of 10 nm to 50 nm.

7. The display device of claim 1, wherein the gate electrode has an area transmittance coefficient (ATC) of 1% to 10%, and the area transmittance coefficient (ATC) is calculated by Equation 1 below:

$$ATC[\%] = T \times A \quad \text{(Equation 1)},$$

in the Equation 1, T is the light transmittance of the second part, which is represented by %, and the light transmittance of the second part is average light transmittance measured in a range from 360 nm to 740 nm, and A is an area ratio of the second part, which is calculated by Equation 2 below:

$$A = (\text{area of the second part that overlaps the channel portion})/(\text{area of the gate electrode that overlaps the channel portion}) \quad \text{(Equation 2)}.$$

8. The display device of claim 1, wherein the second part has a circular shape, an oval shape, a semi-circular shape, a semi-oval shape, or a polygonal plane, in a plan view.

9. The display device of claim 1, wherein the first part is positioned on one side of the gate electrode, and the second part is positioned on another side of the gate electrode.

10. The display device of claim 1, wherein the first part surrounds the second part.

11. The display device of claim 1, wherein the gate electrode includes at least one of molybdenum (Mo) or titanium (Ti).

12. The display device of claim 1, wherein the active layer includes at least one of an IGZO (InGaZnO)-based oxide semiconductor material, a GZO (GaZnO)-based oxide semiconductor material, an IGO (InGaO)-based oxide semiconductor material, an IGZTO (InGaZnSnO)-based oxide semiconductor material, a GZTO (GaZnSnO)-based oxide semiconductor material, an IZO (InZnO)-based oxide semiconductor material, an ITZO (InSnZnO)-based oxide semiconductor material, a FIZO (FeInZnO)-based oxide semiconductor material, a ZnO-based oxide semiconductor material, a SIZO (SiInZnO)-based oxide semiconductor material or a ZnON (Zn-Oxynitride)-based oxide semiconductor material.

13. The display device of claim 1, wherein the active layer includes:
a first oxide semiconductor layer; and
a second oxide semiconductor layer on the first oxide semiconductor layer.

14. The display device of claim 13, wherein the active layer further includes a third oxide semiconductor layer on the second oxide semiconductor layer.

15. The display device of claim 1, further comprising a gate driver disposed on the substrate,
wherein the gate driver includes a second plurality of thin film transistors, and
at least a portion of the second plurality of thin film transistors included in the gate driver is disposed in the first area.

16. The display device of claim 1, further comprising a plurality of pixels disposed on the substrate,
wherein each of the plurality of pixels includes a thin film transistor, and
at least a portion of the plurality of pixels is disposed in the first area.

17. The display device of claim 1, wherein the substrate further includes a second area distinguished from the first area, and
the gate electrode of the another thin film transistor among the plurality of transistors disposed in the second area has a same height as that of the first part without a thickness difference.

18. The display device of claim 1, wherein the substrate further includes a third area distinguished from the first area,
the gate electrode of another thin film transistor among the plurality of thin film transistors disposed in the third area includes:

another first part that at least partially overlaps the channel portion of the active layer of the another thin film transistor in the third area; and another second part having a thickness smaller than the another first part and at least partially overlapping the channel portion of the active layer of the thin film transistor in the third area, and the another second part of the gate electrode included in the thin film transistor disposed in the third area has a smaller area or a larger thickness than that of the second part of the gate electrode included in the thin film transistor disposed in the first area.

19. The display device of claim 18, further comprising a gate driver disposed on the substrate, wherein the gate driver includes a second plurality of thin film transistors, and at least a portion of the second plurality of thin film transistors included in the gate driver is disposed in the third area.

20. The display device of claim 18, further comprising a plurality of pixels disposed on the substrate, wherein each of the plurality of pixels includes a thin film transistor, and at least a portion of the plurality of pixels is disposed in the third area.

* * * * *